(12) United States Patent
Xu et al.

(10) Patent No.: US 11,626,160 B2
(45) Date of Patent: Apr. 11, 2023

(54) DYNAMIC SENSE NODE VOLTAGE TO COMPENSATE FOR VARIANCES WHEN SENSING THRESHOLD VOLTAGES OF MEMORY CELLS

(71) Applicant: SanDisk Technologies LLC, Addison, TX (US)

(72) Inventors: Huiwen Xu, Cupertino, CA (US); Bo Lei, San Ramon, CA (US); Jun Wan, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 53 days.

(21) Appl. No.: 17/166,612

(22) Filed: Feb. 3, 2021

(65) Prior Publication Data

US 2022/0246208 A1 Aug. 4, 2022

(51) Int. Cl.
*G11C 11/34* (2006.01)
*G11C 11/56* (2006.01)
*G11C 16/04* (2006.01)
*G11C 16/26* (2006.01)
*H01L 25/065* (2023.01)
*H01L 23/00* (2006.01)

(52) U.S. Cl.
CPC ...... *G11C 11/5642* (2013.01); *G11C 11/5671* (2013.01); *G11C 16/0483* (2013.01); *G11C 16/26* (2013.01); *H01L 24/08* (2013.01); *H01L 25/0657* (2013.01); *H01L 2224/08145* (2013.01); *H01L 2225/06506* (2013.01); *H01L 2225/06541* (2013.01); *H01L 2225/06562* (2013.01); *H01L 2924/14511* (2013.01)

(58) Field of Classification Search
CPC .. G11C 11/5642; G11C 16/26; G11C 16/0483
See application file for complete search history.

(56) References Cited

U.S. PATENT DOCUMENTS

| | | | |
|---|---|---|---|
| 6,212,108 B1 * | 4/2001 | Akaogi | G11C 7/1048 365/189.09 |
| 7,177,199 B2 | 2/2007 | Chen et al. | |
| 7,460,406 B2 | 12/2008 | Mokhlesi et al. | |

(Continued)

FOREIGN PATENT DOCUMENTS

WO WO 2007/076414 A2 7/2007

*Primary Examiner* — Uyen Smet
(74) *Attorney, Agent, or Firm* — Vierra Magen Marcus LLP

(57) ABSTRACT

Technology for sensing non-volatile memory cells in which one or more sense nodes are charged to a sense voltage having a magnitude that improves sensing accuracy. One sense node may be charged to different sense voltages when sensing different memory cells at different times. Multiple sense nodes may be charged to a corresponding multiple different sense voltages when sensing different memory cells at the same time. The one or more sense nodes are allowed to discharge based on respective currents of memory cells for a pre-determined time while applying a reference voltage to the memory cells. The Vts of the selected memory cells are assessed based on respective voltages on the one or more of sense nodes after the pre-determined time. Different sensing voltages may be used based on bit line voltage, bit line resistance, distance of memory cells from the sense node, or other factors.

18 Claims, 26 Drawing Sheets

(56) References Cited

U.S. PATENT DOCUMENTS

| | | |
|---|---|---|
| 8,559,226 B2 | 10/2013 | Abe et al. |
| 9,269,450 B2 | 2/2016 | Radke et al. |
| 9,443,606 B2 | 9/2016 | Dutta et al. |
| 9,472,298 B1 | 10/2016 | Louie et al. |
| 9,721,671 B2 | 8/2017 | Chu et al. |
| 9,941,013 B2 | 4/2018 | Maejima |
| 10,038,005 B1 | 7/2018 | Zhang et al. |
| 10,720,220 B2 | 7/2020 | Kamata et al. |
| 10,741,257 B1 | 8/2020 | Wu et al. |
| 2009/0003069 A1 | 1/2009 | Lee et al. |
| 2010/0214848 A1* | 8/2010 | Ahn .................. G11C 16/3454 365/185.21 |
| 2019/0392905 A1* | 12/2019 | Hioka .................... G11C 16/32 |
| 2020/0143893 A1 | 5/2020 | Rabkin et al. |

\* cited by examiner

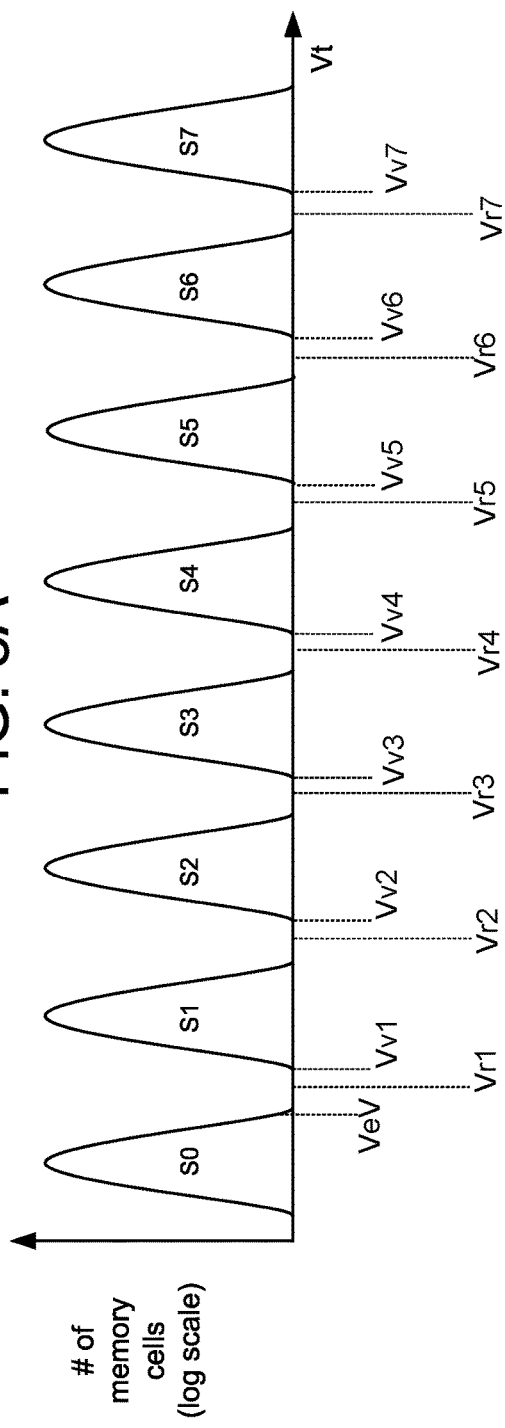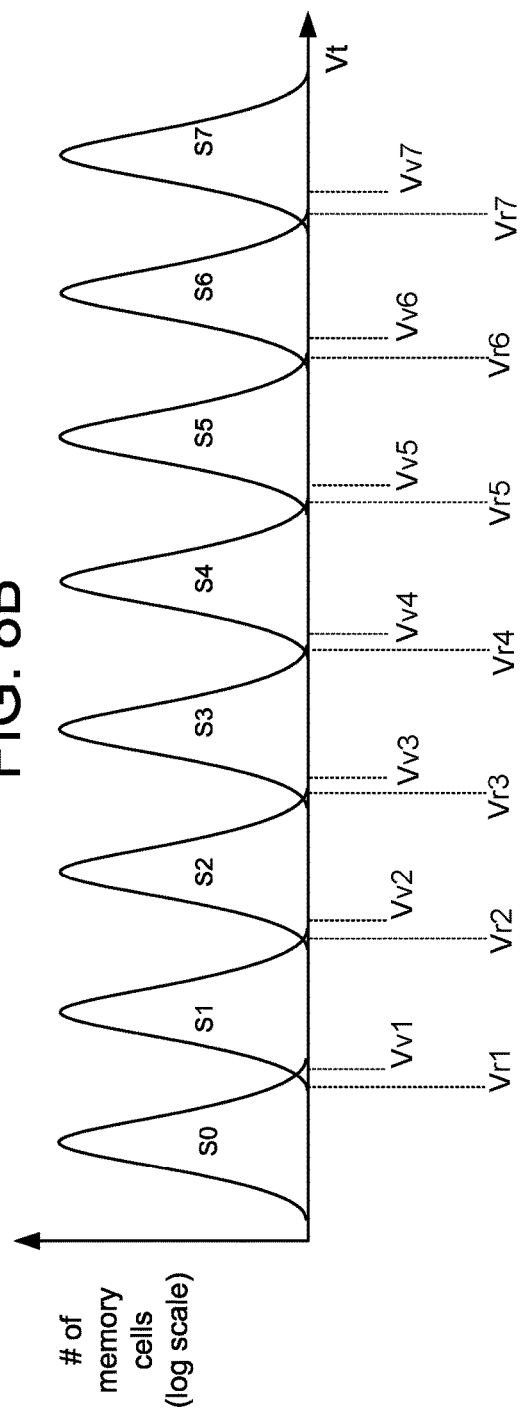

DYNAMIC SENSE NODE VOLTAGE TO COMPENSATE FOR VARIANCES WHEN SENSING THRESHOLD VOLTAGES OF MEMORY CELLS

BACKGROUND

The strong growth in demand for portable consumer electronic devices is driving the need for high-capacity storage devices. Non-volatile semiconductor memory devices (also referred to herein as "non-volatile storage systems" or "non-volatile memory systems"), such as flash memory, are widely used to meet the ever-growing demands on digital information storage and exchange. Their portability, versatility and rugged design, along with their high reliability and large capacity, have made such memory devices ideal for use in a wide variety of host electronic devices, including for example digital cameras, digital music players, video game consoles, PDAs, cellular telephones, and desktop, laptop, and notepad computers. Typically, the host electronic device provides power to the non-volatile storage system.

Non-volatile semiconductor memory devices contain non-volatile memory cells that may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. A memory cell may be programmed to a data state by storing charge in the memory cell. For example, the threshold voltage (Vt) of a NAND memory cell can be set to a target Vt by programming charge into a charge storage region such as charge trapping layer. The amount of charge stored in the charge trapping layer establishes the Vt of the memory cell.

To read the data back from the memory cells it is typical to use read reference voltages in order to determine what data state a memory cell is presently in. If the Vt of the memory cell is at or below the read reference voltage, the memory cell will conduct a significant current. If the Vt of the memory cell is above the read reference voltage, the memory cell will not conduct a significant current. Techniques may be used to sense the memory cell current to determine whether the Vt of the memory cell is above or below the read reference voltage. However, such sensing techniques can suffer from inaccuracies.

DESCRIPTION OF THE DRAWINGS

Like-numbered elements refer to common components in the different Figures.

FIG. 8A illustrates example threshold voltage distributions for the memory array when each memory cell stores three bits of data.

FIG. 8B shows the eight Vt distributions (S0-S7) from FIG. 8A, but shows some spreading of the Vt distributions.

DETAILED DESCRIPTION

Figure 1A:
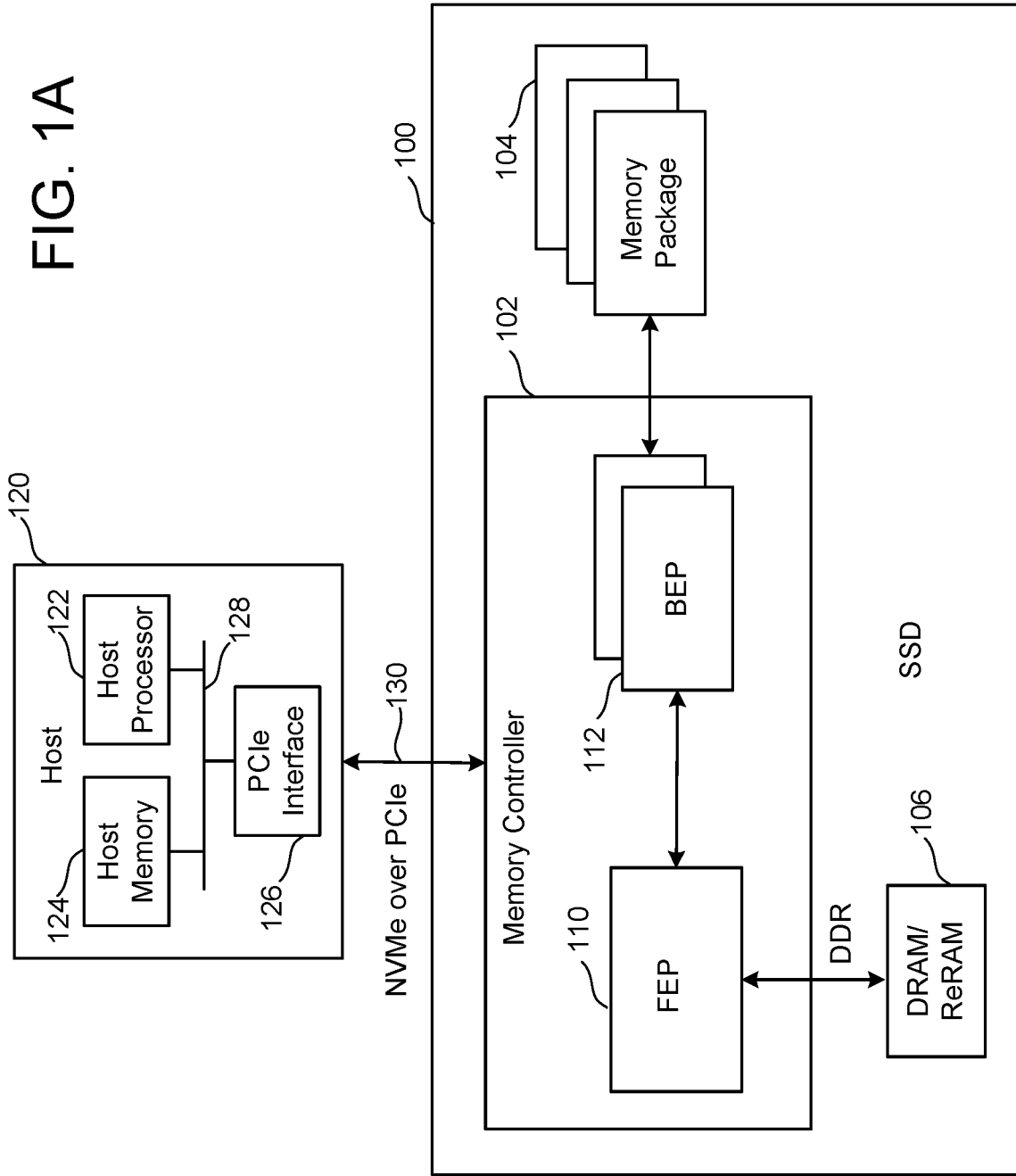
FIG. 1A is a block diagram of one embodiment of a storage system connected to a host.

The present technology will now be described with reference to the figures, which in embodiments, relate to an apparatus and method for sensing non-volatile memory cells. In an embodiment, the voltage to which a sense node is charged has a magnitude that enables more accurate sensing. The memory cell testing includes applying a reference voltage to the memory cell, which may cause the memory cell to conduct a significant current depending on the Vt of the memory cell. After the sense node is charged, the memory cell is connected to the sense node to allow the memory cell current (if any) to discharge the voltage on the sense node for a pre-determined time. The voltage on the sense node after the pre-determined time is indicative of whether the Vt of the memory cell is above or below a target Vt. The target Vt is associated with the reference voltage that was applied to the memory cell.

Note that some memory systems will, in effect, test for a certain memory cell current to determine whether the Vt of the memory cell is above or below a target Vt. This is due to the memory cell current being used to discharge a sense node for a pre-determined time. However, various factors can impact the current of a memory cell having a Vt near the target Vt. One such factor is the voltage on a bit line connected to the memory cell. The memory cell may reside on a NAND string that is connected to the bit line. In some sensing techniques, the bit line is charged to a target voltage and held at the target voltage when sensing the memory cell. However, it is possible for the bit line voltage (at the NAND string) to have some variance from one bit line to the next. This variance in bit line voltage at the NAND string can impact the current of the memory cell by a small amount. However, this small amount can lead to inaccurate sensing. Technology disclosed herein improves the accuracy of sensing memory cells. In some embodiments, if the bit line voltage at the NAND string is expected to be below a target voltage, then the sense node is charged to a lower voltage than normal (for a case in which the bit line voltage is at the target).

A possible factor in the bit line voltage at the NAND strings is the distance between the NAND strings and the sense node. A sense node may be associated with one bit line. However, this bit line may be connectable to many different NAND strings. These NAND strings may be in different blocks of memory cells. Hence, the distance along the bit line will be different depending on the location of the NAND string (or block). In some embodiments, the magnitude of the sense node voltage is varied inversely with the distance between the sense node and the block. Hence, a larger sense node voltage may be used when the block is further from the sense node, which improves accuracy of sensing.

One possible factor in the bit line voltage at the NAND strings is the resistance of the bit line. A higher resistance of the bit line can lead to a lower bit line voltage at the NAND string during sensing. This lower bit line voltage can lead to a lower memory cell current. In some embodiments, the magnitude of the sense node voltage is varied inversely with bit line resistance. Thus, a lower magnitude sense node voltage may be used when the bit line resistance is higher, which improves accuracy of sensing.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

FIG. 1A-6D describe one example of a storage system that can be used to implement the technology disclosed herein.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from storage system 100. In one embodiment, storage system 100 is embedded in host system 120.

Figure 1B:
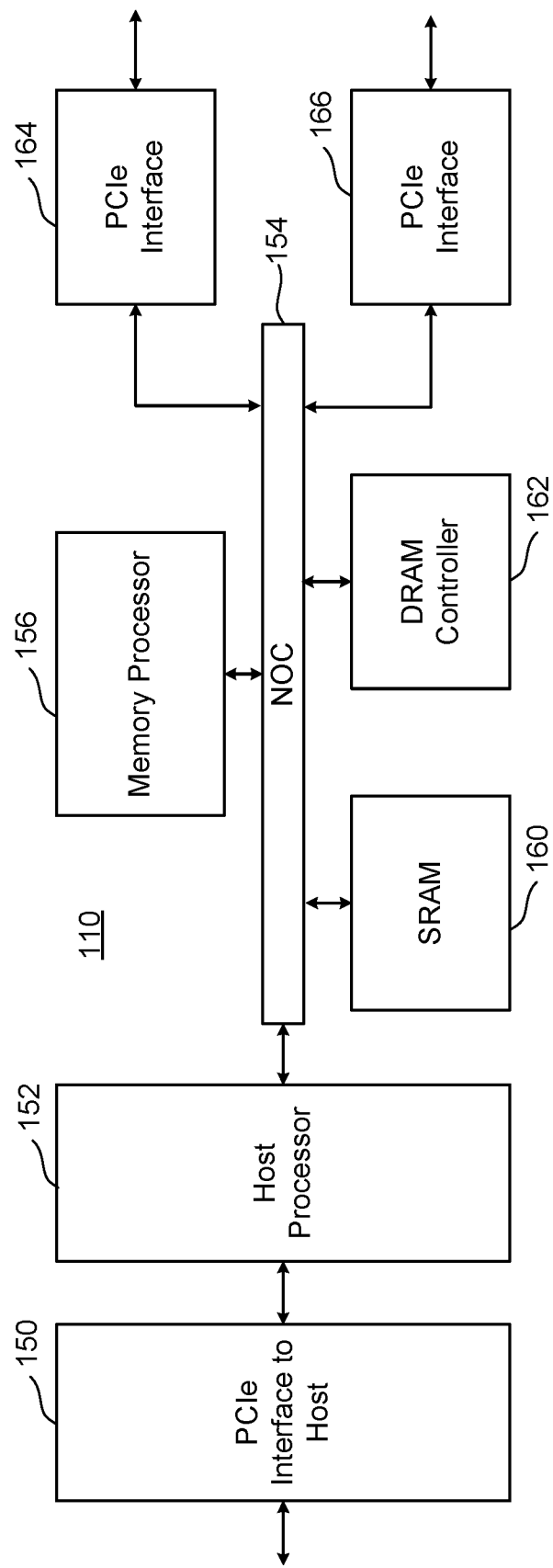
FIG. 1B is a block diagram of one embodiment of a Front End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
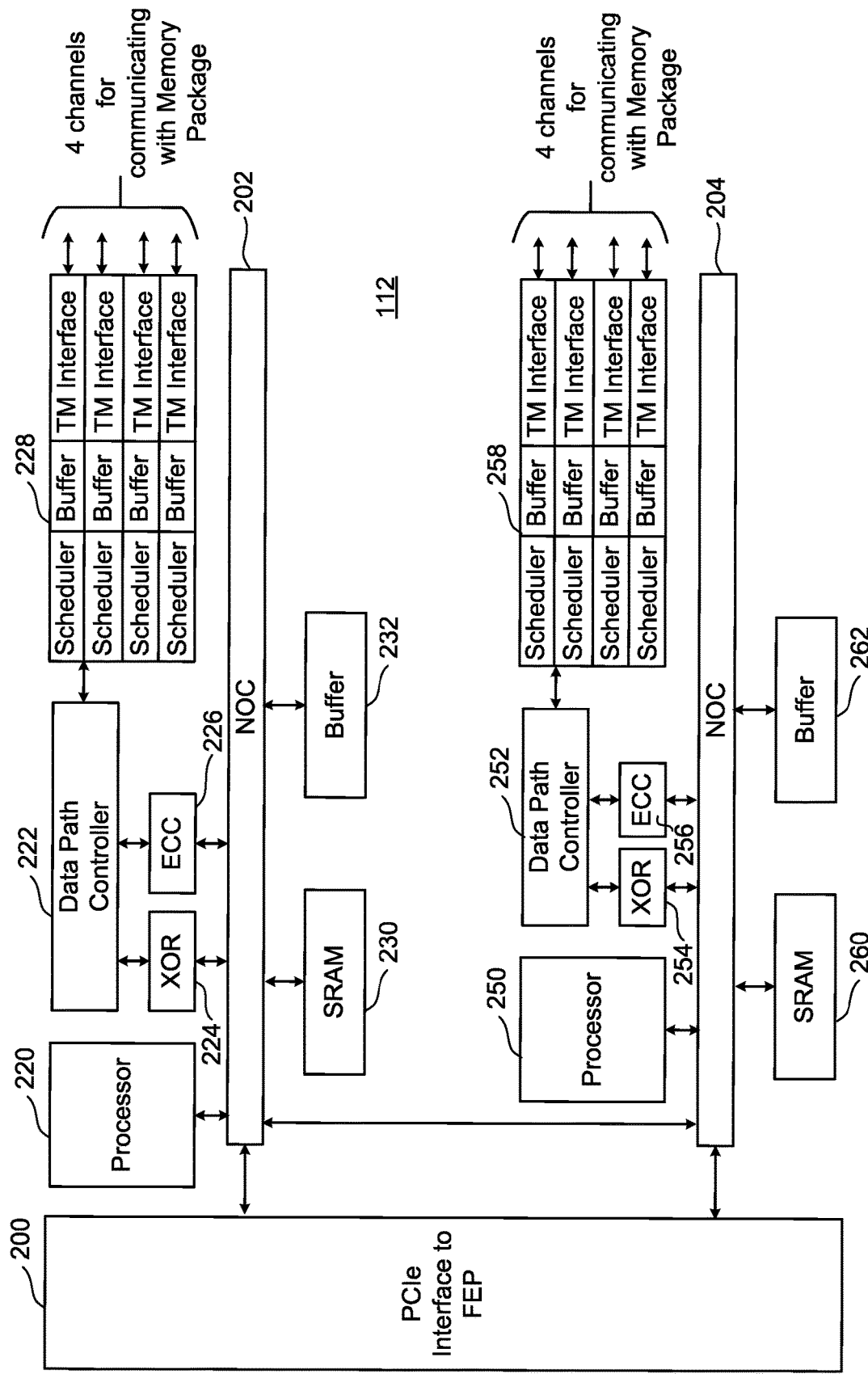
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
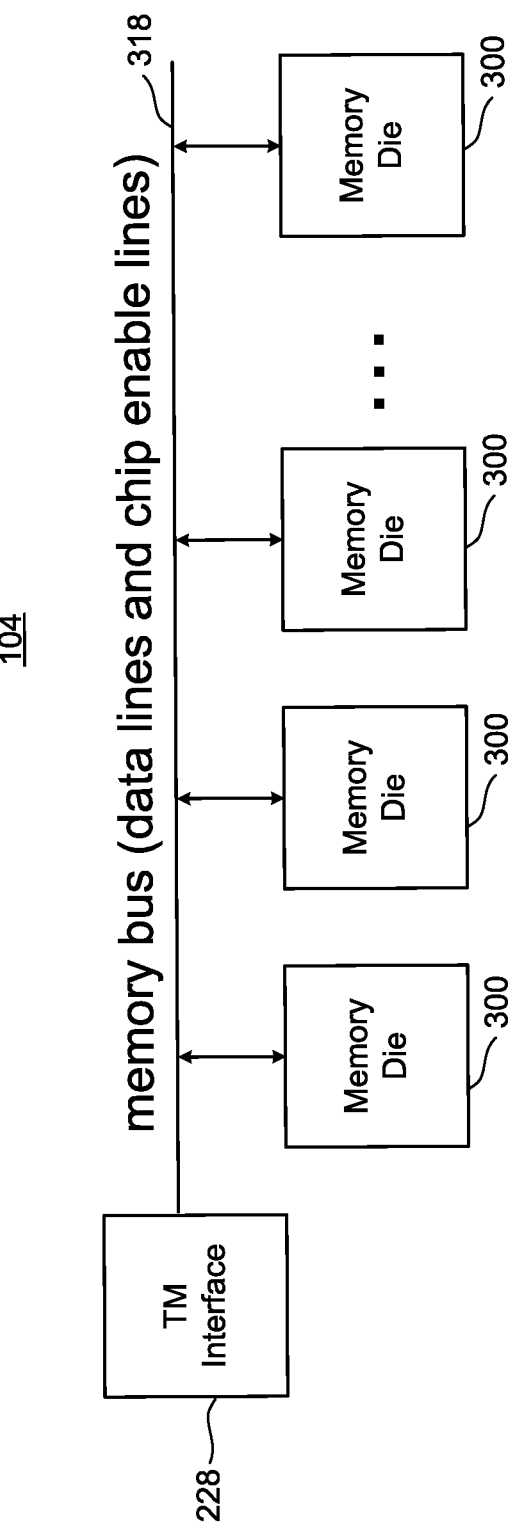
FIG. 2B is a block diagram of one embodiment of a memory package.

FIG. 2B is a block diagram of one embodiment of a memory package 104 that includes a plurality of memory dies 300 connected to a memory bus (data lines and chip enable lines) 322. The memory bus 322 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or 16 memory die; however, other numbers of memory die can also be implemented. The technology described herein is not limited to any particular number of memory die.

Figure 3A:
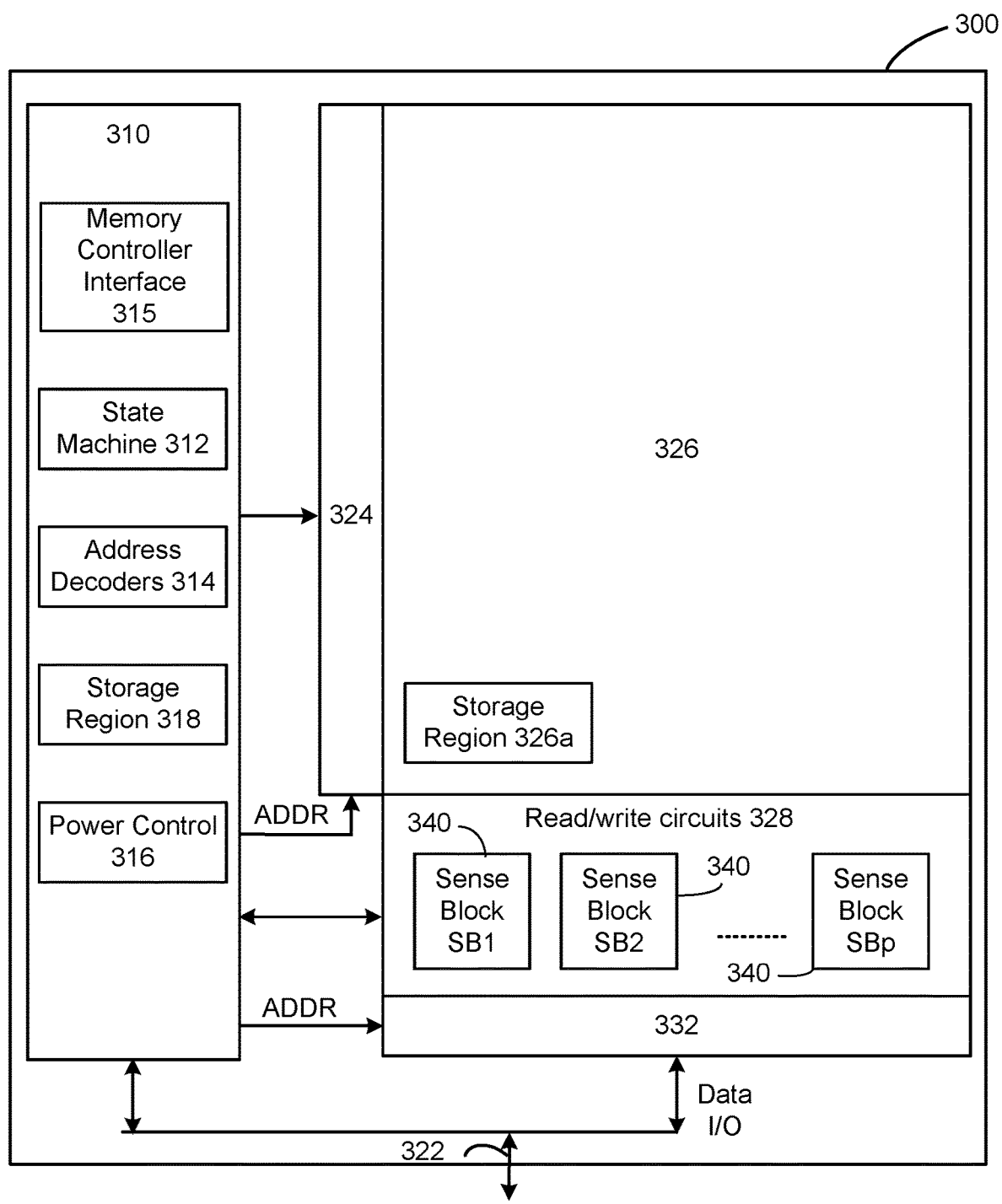
FIG. 3A is a functional block diagram of an embodiment of a memory die.

FIG. 3A is a functional block diagram of one embodiment of a memory die 300. Each of the one or more memory die 300 of FIG. 2B can be implemented as memory die 300 of FIG. 3A. The components depicted in FIG. 3A are electrical circuits. In one embodiment, each memory die 300 includes a memory structure 326, control circuitry 310, read/write circuits 328, and decoders 324/332, all of which are electrical circuits. Memory structure 326 is addressable by word lines via a row decoder 324 and by bit lines via a column decoder 332. The read/write circuits 328 include multiple sense blocks 340 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the memory controller 102 and the memory die 300 via memory controller interface 315 (also referred to as a "communication interface"). Memory controller interface 315 is an electrical interface for communicating with memory controller 102. Examples of memory controller interface 315 include a Toggle Mode Interface and an Open NAND Flash Interface (ONFI). Other I/O interfaces can also be used. For example, memory controller interface 315 may implement a Toggle Mode Interface that connects to the Toggle Mode interfaces of memory interface 228/258 for memory controller 102. In one embodiment, memory controller interface 315 includes a set of input and/or output (I/O) pins that connect to memory bus 322. In one embodiment, memory bus 322 connects to the memory controller 102 as part of the Toggle Mode Interface.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, power control 316, a memory controller interface 315, and storage region 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages, and other parameters. The default values and other parameters could be stored in a region of the memory structure 326 (e.g., structure parameter storage 326a). These default values may be updated from time to time.

The on-chip address decoder 314 provides an address interface between addresses used by memory controller 102 to the hardware address used by the decoders 324 and 332. Power control 316 controls the power and voltages supplied to the word lines and bit lines during memory operations. Power control 316 may include charge pumps for creating voltages.

Storage region 318 may be used to store parameters for operating the memory structure 326. Storage region 318 may include volatile or non-volatile memory. In some embodiments, the parameters include read reference voltages and sense node voltages. In The memory structure 326 has storage region 326a, which may also contain a copy of the parameters for operating the memory structure 326. In some embodiments, the parameters are copied from storage region 326a to storage region 318 when the memory die 300 is powered on.

For purposes of this document, control circuitry 310, alone or in combination with read/write circuits 328 and decoders 324/332, comprise a control circuit connected to memory structure 326. The control circuit is an electrical circuit that performs the functions described below in the flow charts. In other embodiments, the control circuit can consist only of memory controller 102 (or other controller), which is an electrical circuit in combination with software (e.g., firmware), that performs the functions described below in the flow charts. In one embodiment, the control circuit is the controller where the controller is an electrical circuit that does not use hardware. In another alternative, the control circuit comprises memory controller 102 and control circuitry 310 performing the functions described below in the flow charts. In another embodiment, the control circuit comprises state machine 312 (and/or a microcontroller and/or microprocessor) alone or in combination with memory controller 102. In another alternative, the control circuit comprises memory controller 102, control circuitry 310, read/write circuits 328 and decoders 324/332 performing the functions described below in the flow charts. In other embodiments, the control circuit comprises one or more electrical circuits that operate the non-volatile memory.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3B:
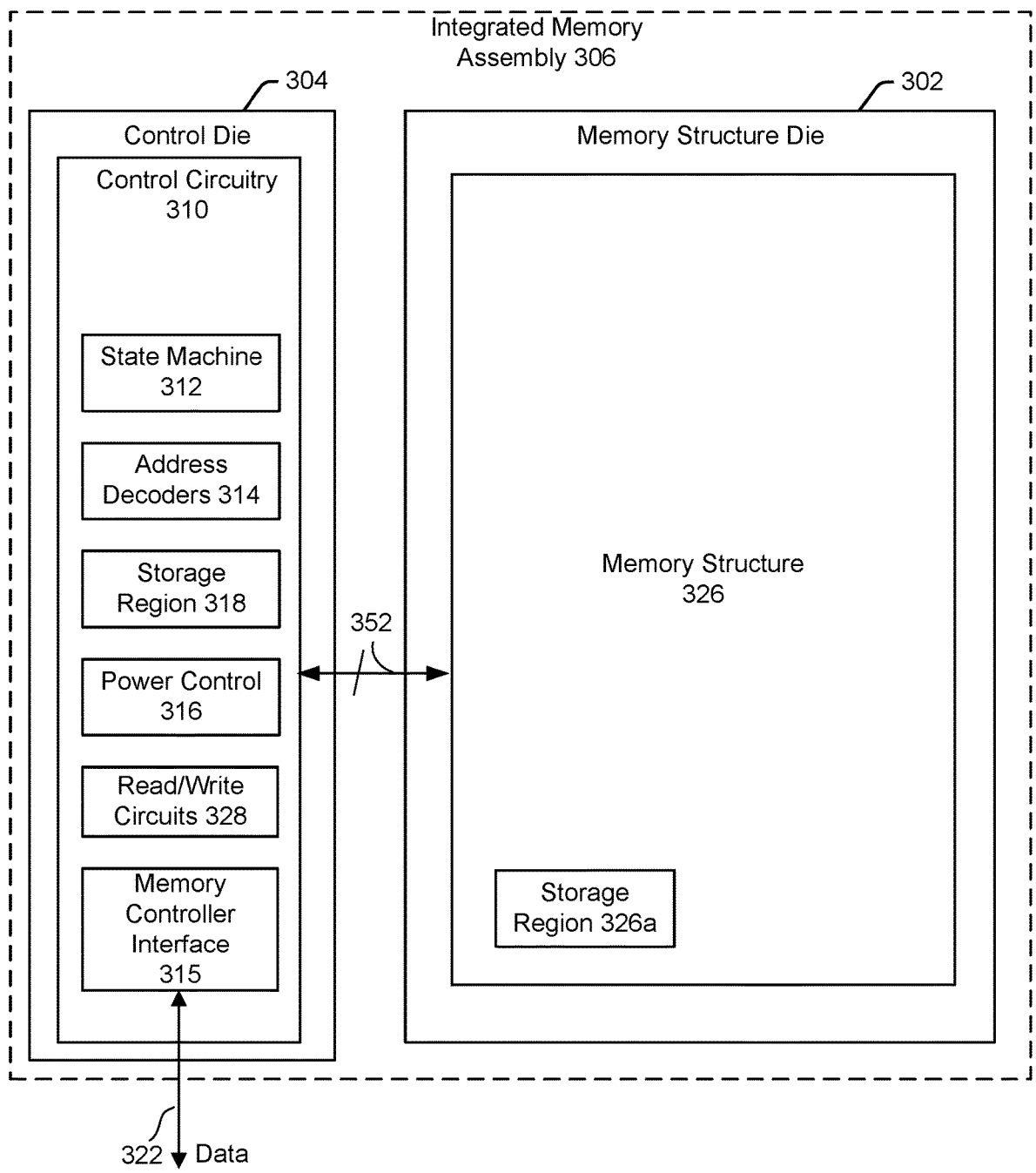
FIG. 3B is a functional block diagram of an embodiment of an integrated memory assembly.

FIG. 3B depicts a functional block diagram of one embodiment of an integrated memory assembly 306. The integrated memory assembly 306 may be used in a memory package 104 in storage system 100. In one embodiment, the integrated memory assembly 306 includes two types of semiconductor die (or more succinctly, "die"). Memory structure die 302 includes memory structure 326. Memory structure 326 may contain non-volatile memory cells. Control die 304 includes control circuitry 310. In some embodiments, the control die 304 is configured to connect to the memory structure 326 in the memory structure die 302. For example, the control circuitry 310 is configured to be connected to non-volatile memory cells in memory structure 326 in memory structure die 302. In some embodiments, the memory structure die 302 and the control die 304 are bonded together. The control circuitry 310 includes state machine 312, an address decoder 314, power control 316, memory controller interface 315, and storage region 318. Storage region may store parameters such as read reference voltages and sense node voltages. The control circuitry 310 also includes read/write circuits 328. In another embodiment, a portion of the read/write circuits 328 are located on control die 304, and a portion of the read/write circuits 328 are located on memory structure die 302. The term apparatus as used herein may include, but is not limited to, memory die 300, control die 304, memory package 104, storage system 100, memory controller 102, or a host system 120 that includes a storage system 100.

Any subset of components in the control circuitry 310 of control die 304 can be considered a control circuit. In another alternative, the control circuit comprises memory controller 102 and control circuitry 310 of control die 304 performing the functions described below in the flow charts. The control circuit can include hardware only or a combination of hardware and software (including firmware). For example, a controller programmed by firmware is one example of a control circuit. A control circuit can include a processor, PGA (Programmable Gate Array, FPGA (Field Programmable Gate Array), ASIC (Application Specific Integrated Circuit), integrated circuit or other type of circuit.

Pathways 352 are pathways between one or more components in the control circuitry 310 and the memory structure on memory structure die 302. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. A pathway may be used to provide a read reference voltage from the power control 316 to a selected word line connected to memory cells being read in the memory structure 326.

In one embodiment, integrated memory assembly 306 includes a set of input and/or output (I/O) pins that connect to memory bus 322. Memory bus 322 is depicted as being connected to memory controller interface 315.

Figure 4:
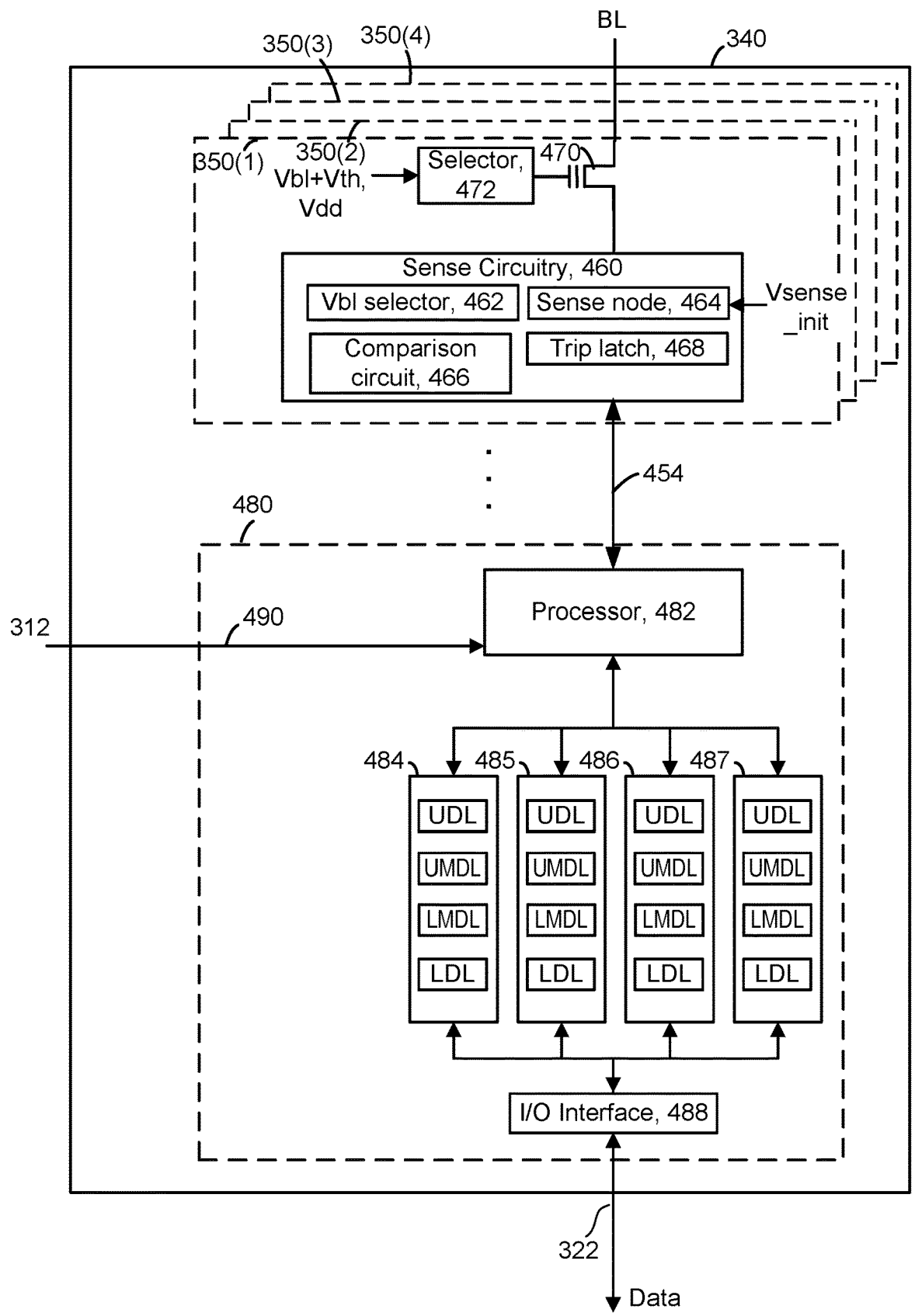
FIG. 4 is a block diagram depicting one embodiment of a sense block.

FIG. 4 is a block diagram depicting one embodiment of a sense block 340. The sense block is part of the read/write circuits 328. An individual sense block 340 is partitioned into one or more core portions, referred to as sense circuits or sense amplifiers 350(1)-350(4), and a common portion, referred to as a managing circuit 480. In one embodiment, there will be a separate sense circuit for each bit line/NAND string and one common managing circuit 480 for a set of multiple, e.g., four or eight, sense circuits. Each of the sense circuits in a group communicates with the associated managing circuit via data bus 454. Thus, there are one or more managing circuits which communicate with the sense circuits of a set of storage elements (memory cells).

The sense amplifier 350(1), as an example, comprises sense circuitry 460 that performs sensing by determining whether a conduction current in a connected bit line is above or below a predetermined threshold level. The sensing can occur in a read or verify operation. The sense circuit also supplies a bit line voltage during the application of a program voltage in a program operation. Note that other circuitry (e.g., power control 316 under control of state machine 312) may control the application of voltages to the word lines during read or program. Thus, state machine 312 may control power control 316 to control the timing of read reference voltages (as well as other voltages) to the word lines.

The sense circuitry 460 may include a Vbl selector 462, a sense node 464, a comparison circuit 466 and a trip latch 468. During the application of a program voltage, the Vbl selector 462 can pass a program enable voltage (e.g., V_pgm_enable) or a program-inhibit voltage (e.g., Vbl_inh) to a bit line connected to a memory cell. Program inhibit voltages are applied to bit lines coupled to memory cells that are not to be programmed and/or bit lines having memory cells that have reached their respective target threshold voltage through execution of a programming process. These may be referred to as "unselected bit lines." When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 470 (e.g., an nMOS) can be configured as a pass gate to pass Vbl from the Vbl selector 462, by setting the control gate voltage of the transistor sufficiently high, e.g., higher than the Vbl passed from the Vbl selector. For example, a selector 472 may pass a power supply voltage Vdd, e.g., 3-4 V to the control gate of the transistor 470.

The sense amplifier 350(1) is configured to control the timing of when the voltages are applied to the bit line. During sensing operations such as read and verify operations, the bit line voltage is set by the transistor 470 based on the voltage passed by the selector 472. The bit line voltage is roughly equal to the control gate voltage of the transistor minus its Vt (e.g., 3 V). For example, if Vbl+Vt is passed by the selector 472, the bit line voltage will be Vbl. This assumes the source line is at 0 V. Also, note that the bit line voltage may be somewhat different where the bit line connects to the NAND string relative to the bit line voltage at the sense amplifier. The transistor 470 clamps the bit line voltage according to the control gate voltage and acts as a source-follower rather than a pass gate. The Vbl selector 462 may pass a relatively high voltage such as Vdd which is higher than the control gate voltage on the transistor 470 to provide the source-follower mode. During sensing, the transistor 470 thus charges up the bit line.

In one approach, the selector 472 of each sense amplifier can be controlled separately from the selectors of other sense amplifiers, to pass Vbl or Vdd. The Vbl selector 462 of each sense amplifier can also be controlled separately from the Vbl selectors of other sense amplifiers.

During sensing, the sense node 464 is charged up to an initial voltage such as Vsense_init. In some embodiments, Vsense_init is established at different values to improve the accuracy of sensing. The sense node is then connected to the bit line via the transistor 470, and an amount of decay of the voltage on the sense node is used to determine whether a memory cell is in a conductive or non-conductive state. In one embodiment, a current that flows in the bit line discharges the sense node (e.g., sense capacitor). The length of time that the sense node is allowed to decay may be referred to herein as an "integration time." The comparison circuit 466 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 350(1) includes a trip latch 468 that is set by the comparison circuit 466 based on whether the memory cell is in a conductive or non-conductive state. The data in the trip latch can be a bit which is read out by the processor 482.

When the memory cell is connected to the sense node, the current at the sense node may be substantially the same as the memory cell current. Equation 1 describes capacitive current in differential form. Equation 2 describes capacitive voltage in integral form.

$$i = C\frac{dv}{dt} \quad \text{Eq. 1}$$

$$v = v_0 - \frac{1}{C}\int_0^T i \, dt \quad \text{Eq. 2}$$

The capacitance (C) in Equations 1 and 2 is the capacitance of the sense node 464. The integration time [0, T] is represented in Equation 2. Thus, the integration time is the time for which the memory cell current discharges the sense node. The initial voltage at the sense node is $v_0$ in Equation 2. Since the current that flows from the sense node is substantially the same as the memory cell current, then i in Equation 1 or 2 is substantially the same as the memory cell current. Stated another way, the memory cell current discharges the sense node for the integration time [0, T]. Although the memory cell current discharges the sense node voltage in this example, the memory cell current could be used to charge the sense node.

In some embodiments, the initial voltage at the sense node is chosen to improve sensing accuracy. For example, differences in bit line voltages can lead to differences in memory cell current. In some embodiments, the initial voltage at the sense node is chosen to mitigate differences in bit line voltages.

Also note that if the memory cell current is substantially constant when the memory cell is connected to the sense node, then Equation 3 represents the memory cell current (icell). In Equation 3, C is the capacitance of the sense node, $\Delta v$ is the change of voltage on the sense node, and $\Delta v$ is the integration time.

$$icell = C\frac{\Delta v}{\Delta t} \quad \text{Eq. 3}$$

The managing circuit 480 comprises a processor 482, four example sets of data latches 484, 485, 486, 487 and an I/O Interface 488 coupled between the sets of data latches and data bus 322 (data bus may connect to the memory controller 102). One set of data latches, e.g., comprising individual latches LDL, LMDL, UMDL, and UDL, can be provided for each sense amplifier. In some cases, fewer or additional data latches may be used. LDL stores a bit for a lower page of data, LMDL stores a bit for a lower-middle page of data, UMDL stores a bit for an upper-middle page of data, and UDL stores a bit for an upper page of data. This is in a sixteen level or four bits per memory cell memory device. In one embodiment, there are eight levels or three bits per memory cell.

The processor 482 performs computations, such as to determine the data stored in the sensed memory cell and store the determined data in the set of data latches. Each set of data latches 484-487 is used to store data bits determined by processor 482 during a read operation, and to store data bits imported from the data bus 322 during a program operation which represent write data meant to be programmed into the memory. I/O interface 488 provides an interface between data latches 484-487 and the data bus 322. The processor 482 may also be used to determine what voltage to apply to the bit line, based on the state of the latches.

During reading, the operation of the system is under the control of state machine 312 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 482 via the data bus 454. At that point, processor 482 determines the resultant memory state by consideration of the tripping event(s) of the sense circuit and the information about the applied control gate voltage from the state machine via input lines 490. It then computes a binary encoding for the memory state and stores the resultant data bits into data latches 484-487.

Some implementations can include multiple processors 482. In one embodiment, each processor 482 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense amplifiers, the state machine needs to read the wired-OR line four times, or logic is added to processor 482 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 484-487 from the data bus 322, in the LDL, LMDL, UMDL, and UDL latches, in a four-bit per memory cell implementation.

The program operation, under the control of the state machine, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 482 monitors the read back memory state relative to the desired memory state. When the two are in agreement, the processor 482 sets the bit line in a program inhibit mode such as by updating its latches. This inhibits the memory cell coupled to the bit line from further programming even if additional program pulses are applied to its control gate.

Each set of data latches 484-487 may be implemented as a stack of data latches for each sense amplifier. In one embodiment, there are three data latches per sense amplifier 350. In some implementations, the data latches are implemented as a shift register so that the parallel data stored therein is converted to serial data for data bus 322, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An LMDL, UMDL or UDL latch is flipped when a lower-middle, upper-middle or upper page bit, respectively, is stored in an associated memory cell. This occurs when an associated memory cell completes programming.

Figure 5A:
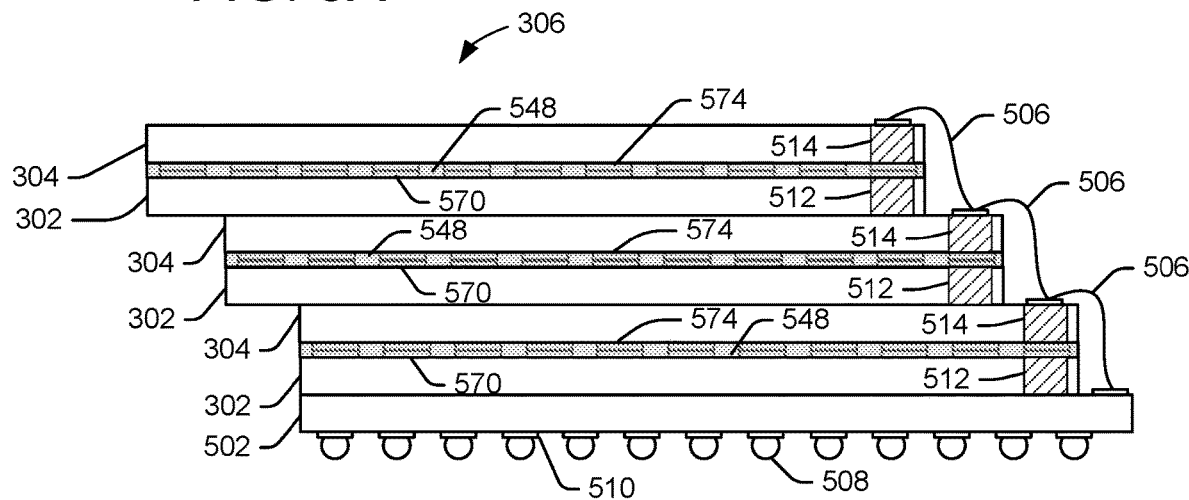
FIG. 5A depicts a side view of an embodiment of an integrated memory assembly stacked on a substrate.

In some embodiments, there is more than one control die 304 and more than one memory structure die 302 in an integrated memory assembly 306. In some embodiments, the integrated memory assembly 306 includes a stack of multiple control die 304 and multiple memory structure die 302. FIG. 5A depicts a side view of an embodiment of an integrated memory assembly 306 stacked on a substrate 502 (e.g., a stack comprising control dies 304 and memory structure dies 302). The integrated memory assembly 306 has three control dies 304 and three memory structure dies 302. In some embodiments, there are more than three memory structure dies 302 and more than three control die 304.

Each control die 304 is affixed (e.g., bonded) to at least one of the memory structure dies 302. Some of the bond pads 570, 574, are depicted. There may be many more bond pads. A space between two dies 302, 304 that are bonded together is filled with a solid layer 548, which may be formed from epoxy or other resin or polymer. This solid layer 548 protects the electrical connections between the dies 302, 304, and further secures the dies together. Various materials may be used as solid layer 548, but in embodiments, it may be Hysol epoxy resin from Henkel Corp., having offices in California, USA.

The integrated memory assembly 306 may for example be stacked with a stepped offset, leaving the bond pads at each level uncovered and accessible from above. Wire bonds 506 connected to the bond pads connect the control die 304 to the substrate 502. A number of such wire bonds may be formed across the width of each control die 304 (i.e., into the page of FIG. 5A).

A memory structure die through silicon via (TSV) 512 may be used to route signals through a memory structure die 302. A control die through silicon via (TSV) 514 may be used to route signals through a control die 304. The TSVs 512, 514 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 508 may optionally be affixed to contact pads 510 on a lower surface of substrate 502. The solder balls 508 may be used to electrically and mechanically couple the integrated memory assembly 306 to a host device such as a printed circuit board. Solder balls 508 may be omitted where the integrated memory assembly 306 is to be used as an LGA package. The solder balls 508 may form a part of the interface between the integrated memory assembly 306 and the memory controller 102.

Figure 5B:
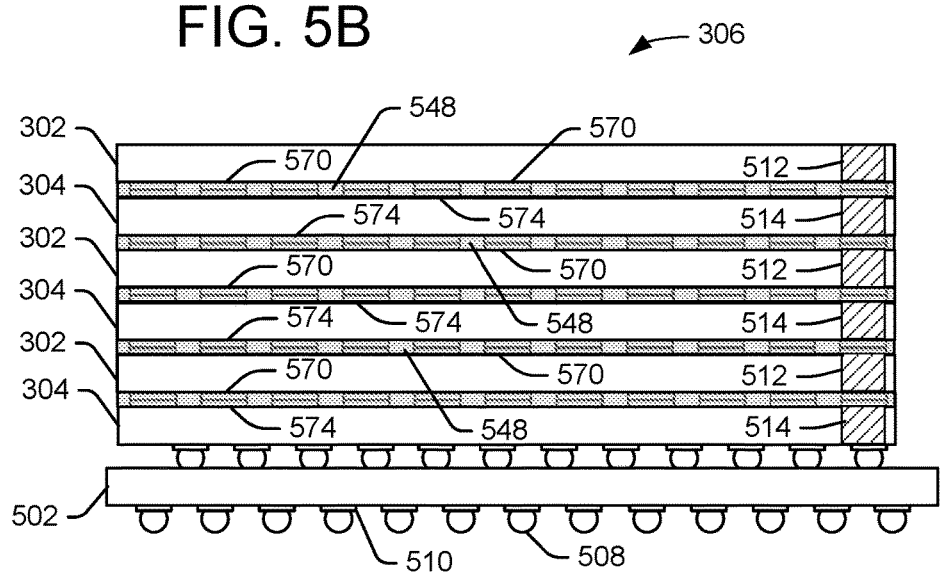
FIG. 5B depicts a side view of an embodiment of an integrated memory assembly stacked on a substrate.

FIG. 5B depicts a side view of an embodiment of an integrated memory assembly 306 stacked on a substrate 502. The integrated memory assembly 306 has three control die 304 and three memory structure die 302. In some embodiments, there are many more than three memory structure dies 302 and many more than three control dies 304. In this example, each control die 304 is bonded to at least one memory structure die 302. Optionally, a control die 304 may be bonded to two memory structure die 302.

Some of the bond pads 570, 574 are depicted. There may be many more bond pads. A space between two dies 302, 304 that are bonded together is filled with a solid layer 548, which may be formed from epoxy or other resin or polymer. In contrast to the example in FIG. 5A, the integrated memory assembly 306 in FIG. 5B does not have a stepped offset. A memory structure die through silicon via (TSV) 512 may be used to route signals through a memory structure die 302. A control die through silicon via (TSV) 514 may be used to route signals through a control die 304.

Solder balls 508 may optionally be affixed to contact pads 510 on a lower surface of substrate 502. The solder balls 508 may be used to electrically and mechanically couple the integrated memory assembly 306 to a host device such as a printed circuit board. Solder balls 508 may be omitted where the integrated memory assembly 306 is to be used as an LGA package.

As has been briefly discussed above, the control die 304 and the memory structure die 302 may be bonded together. Bond pads on each die 302, 304 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 302, 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 6:
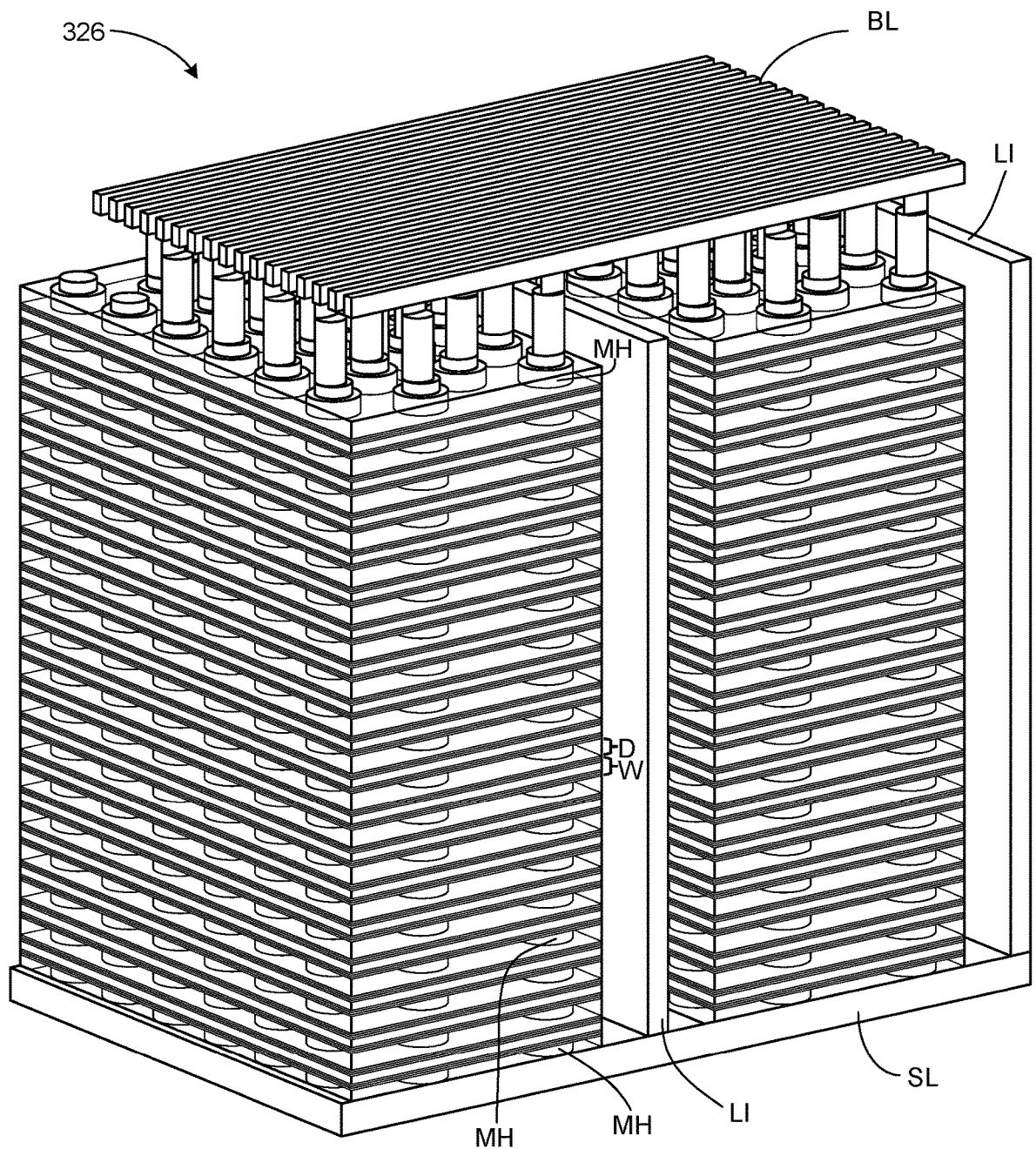
FIG. 6 is a perspective view of a portion of one example embodiment of a monolithic three dimensional memory array that can comprise memory structure.

FIG. 6 is a perspective view of a portion of one example embodiment of a monolithic three dimensional memory array that can comprise memory structure 326, which includes a plurality non-volatile memory cells. For example, FIG. 6 shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 6 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 6, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 6A:
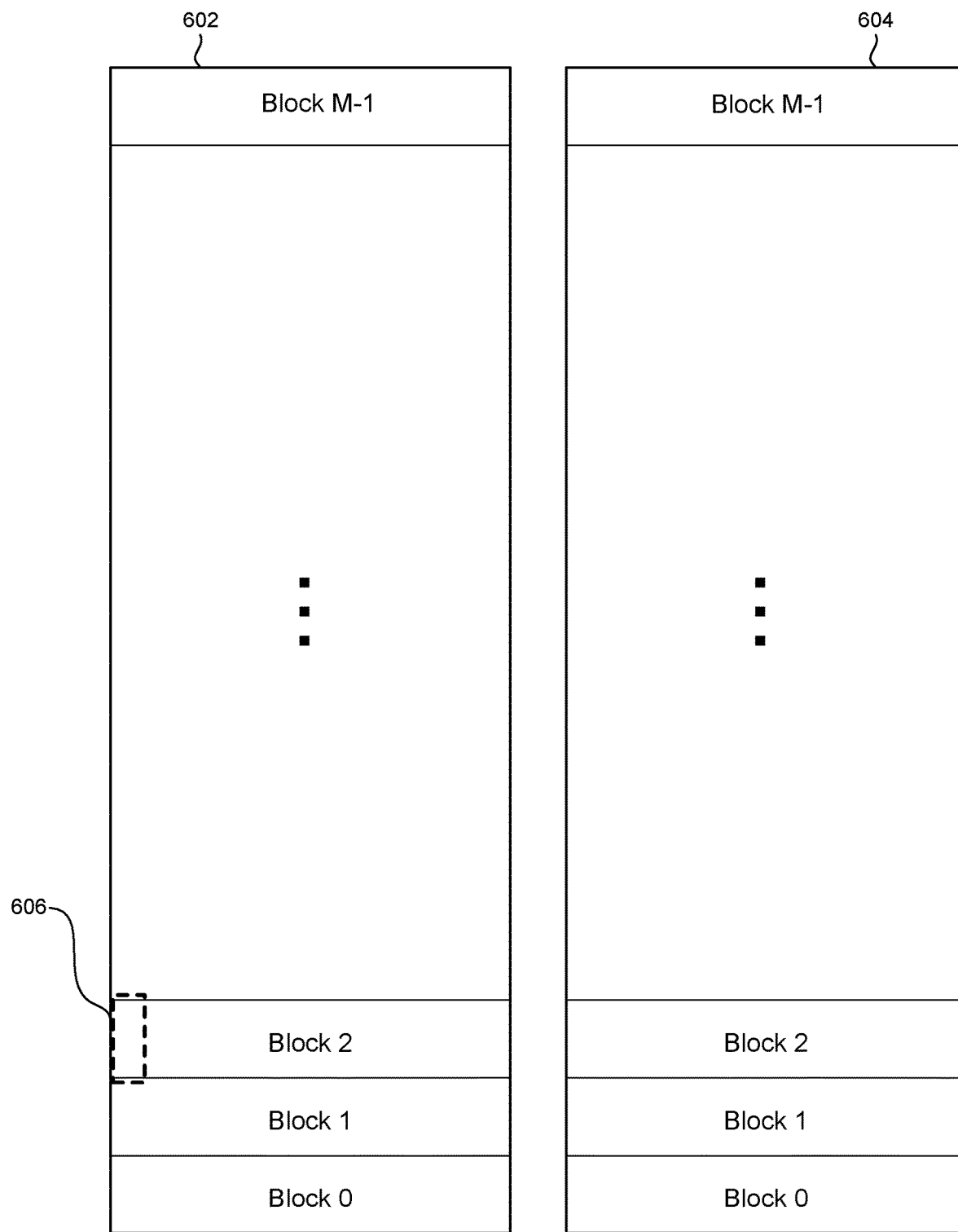
FIG. 6A is a block diagram explaining one example organization of memory structure.

FIG. 6A is a block diagram explaining one example organization of memory structure 326, which is divided into two planes 602 and 604. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 602 includes block 0, 2, 4, 6, . . . and plane 604 includes blocks 1, 3, 5, 7, . . . In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits.

Figure 6B:
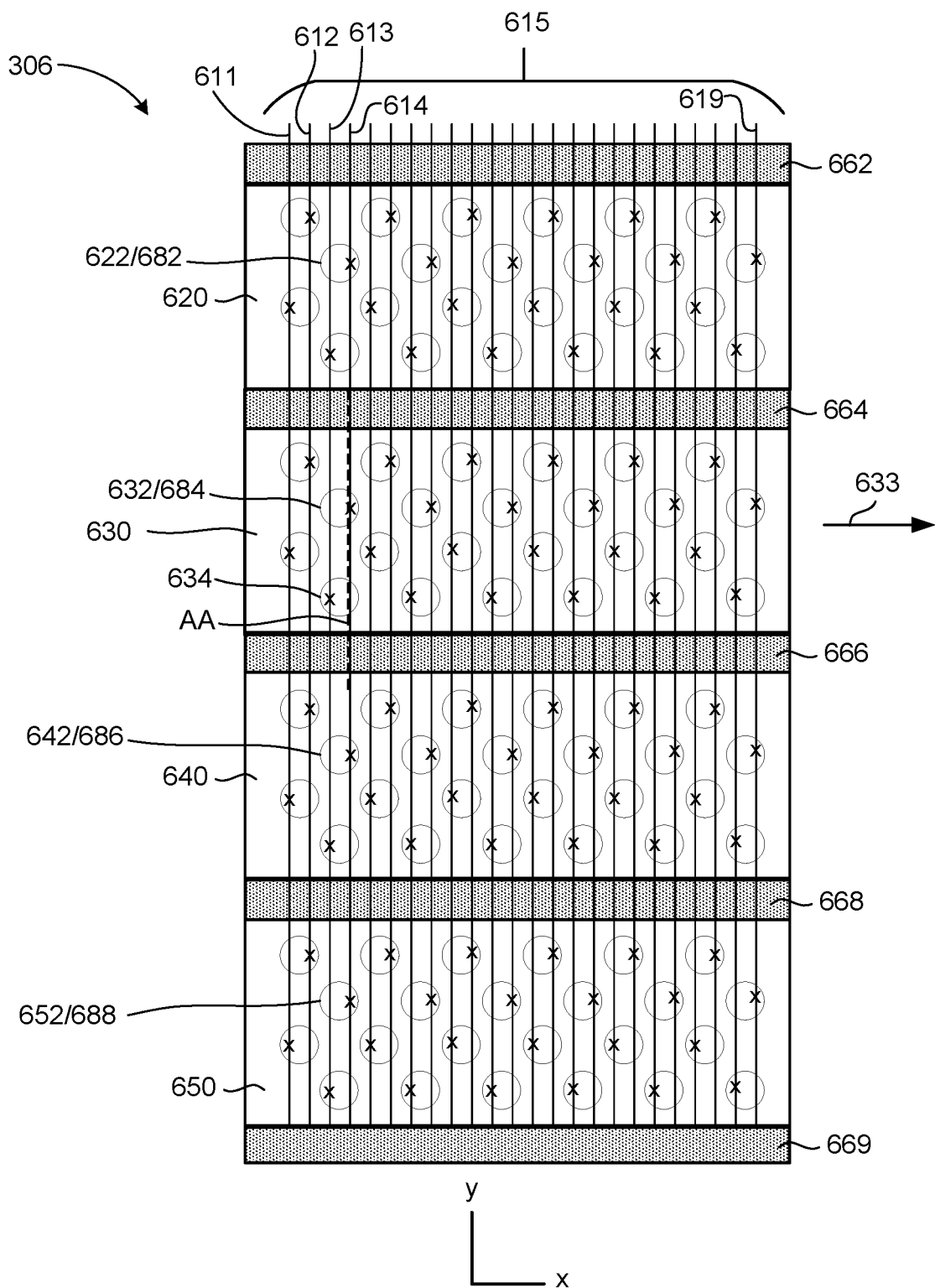
FIG. 6B is a block diagram depicting a top view of a portion of one block from memory structure.
Figure 6C:
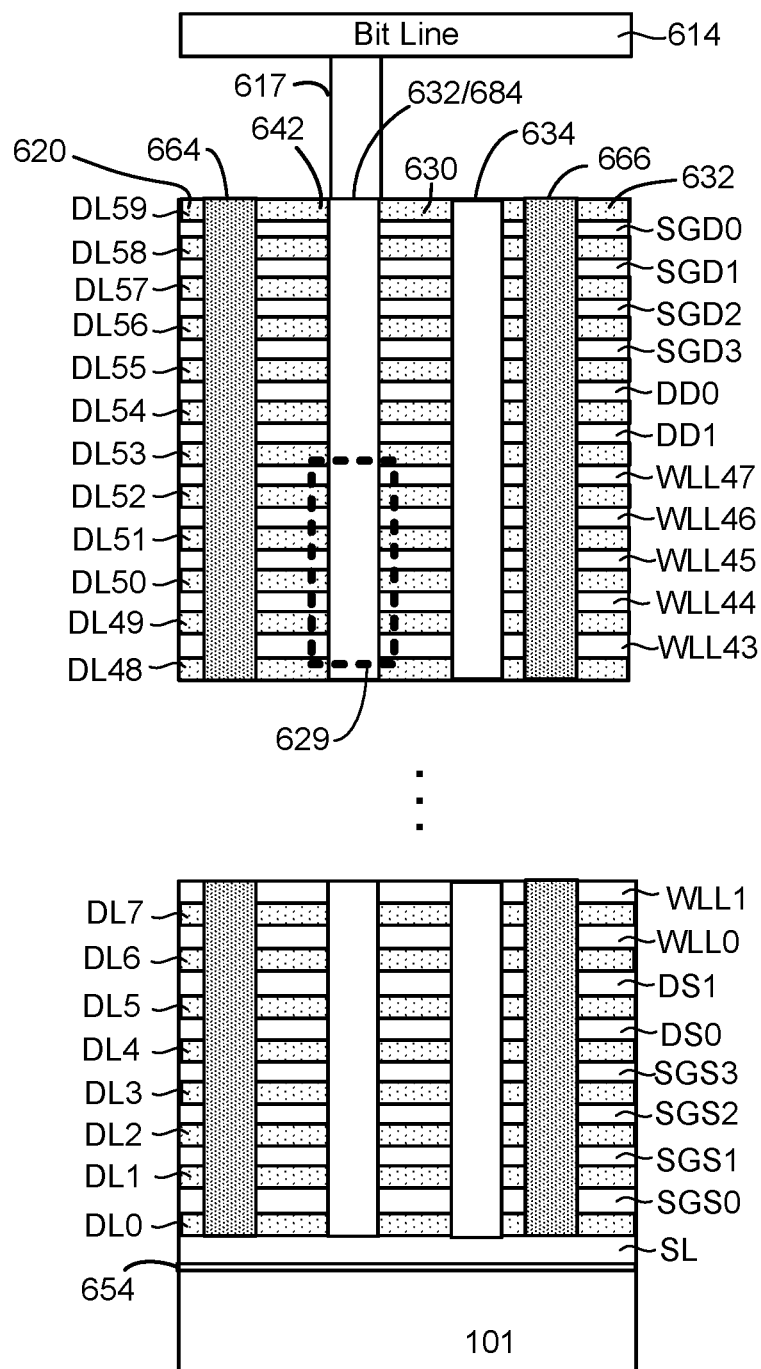
FIG. 6C depicts a portion of an embodiment of three dimensional memory structure showing a cross-sectional view along line AA of FIG. 6B.
Figure 6D:
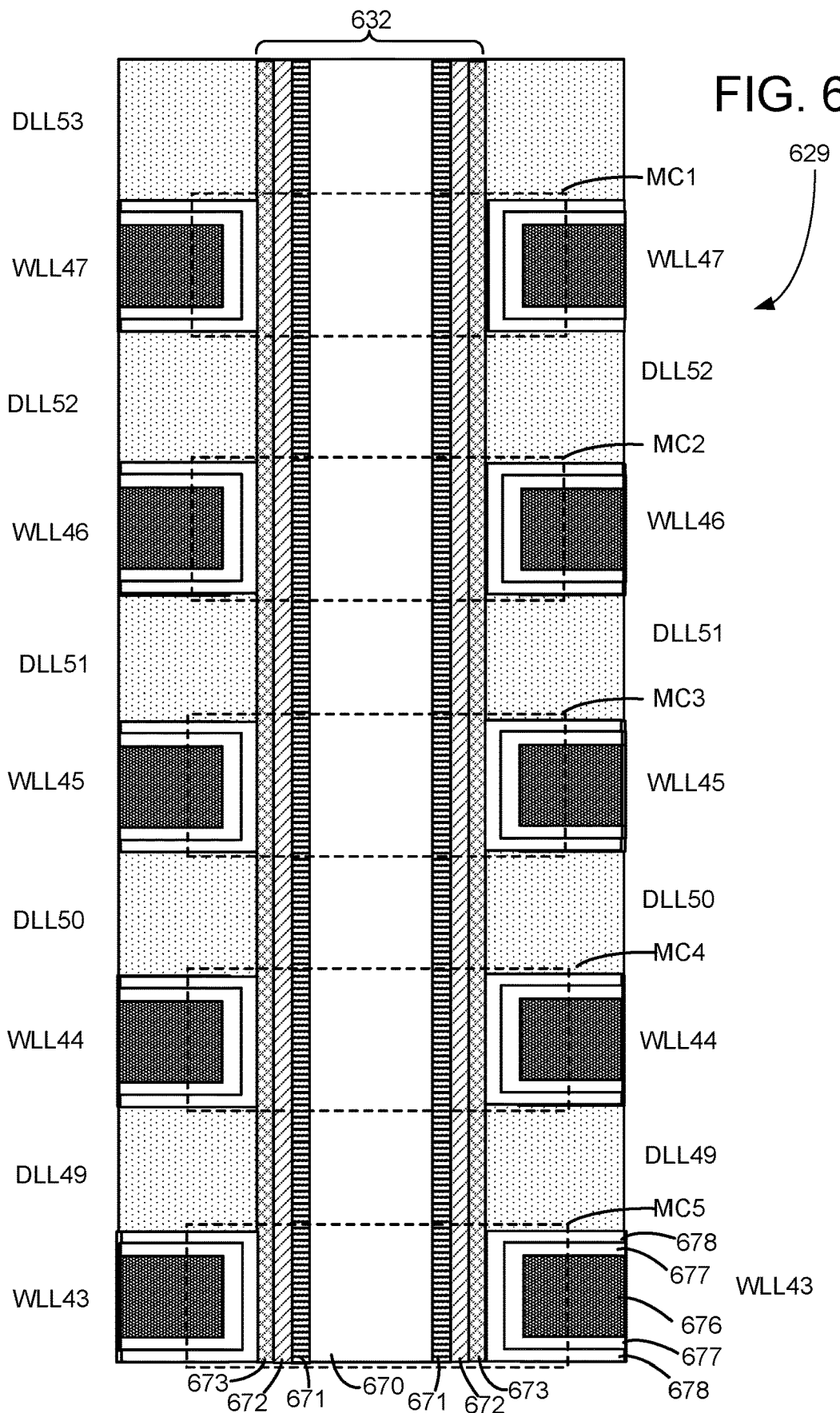
FIG. 6D depicts a cross sectional view of region 629 of FIG. 6C that includes a portion of vertical column 632.

FIGS. 6B-6D depict an example 3D NAND structure. FIG. 6B is a block diagram depicting a top view of a portion of one block from memory structure 326. The portion of the block depicted in FIG. 6B corresponds to portion 606 in block 2 of FIG. 6A. As can be seen from FIG. 6B, the block depicted in FIG. 6B extends in the direction of 633. In one embodiment, the memory array will have 60 layers. Other embodiments have less than or more than 60 layers. However, FIG. 6B only shows the top layer.

FIG. 6B depicts a plurality of circles that represent the vertical columns. Each of the vertical columns include multiple select transistors and multiple memory cells. In one embodiment, each vertical column implements a NAND string. For example, FIG. 6B depicts vertical columns 622, 632, 642 and 652. Vertical column 622 implements NAND string 682. Vertical column 632 implements NAND string 684. Vertical column 642 implements NAND string 686. Vertical column 652 implements NAND string 688. More details of the vertical columns are provided below. Since the block depicted in FIG. 6B extends in the direction of arrow 633 and in the direction of arrow 633, the block includes more vertical columns than depicted in FIG. 6B.

FIG. 6B also depicts a set of bit lines 615, including bit lines 611, 612, 613, 614, . . . 619. FIG. 6B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 614 is connected to vertical columns 622, 632, 642 and 652.

The block depicted in FIG. 6B includes a set of local interconnects 662, 664, 666, 668 and 669 that connect the various layers to a source line below the vertical columns. Local interconnects 662, 664, 666, 668 and 669 also serve to divide each layer of the block into four regions; for example, the top layer depicted in FIG. 6B is divided into regions 620, 630, 640 and 650, which are referred to as fingers or sub-blocks. In the layers of the block that implement memory cells, the four regions are referred to as word line sub-blocks that are separated by the local interconnects. In one embodiment, the word line sub-blocks on a common level of a block connect together at the end of the block to form a single word line. In another embodiment, the word line sub-blocks on the same level are not connected together. In one example implementation, a bit line only connects to one vertical column in each of regions 620, 630, 640 and 650. In that implementation, each block has sixteen rows of active columns and each bit line connects to four rows in each block. In one embodiment, all of four rows connected to a common bit line are connected to the same word line (via different word line sub-blocks on the same level that are connected together); therefore, the system uses the source side select lines and the drain side select lines to choose one (or another subset) of the four to be subjected to a memory operation (program, verify, read, and/or erase).

Although FIG. 6B shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 6B also shows the vertical columns being staggered. In other embodiments, different patterns of staggering can be used. In some embodiments, the vertical columns are not staggered.

FIG. 6C depicts a portion of an embodiment of three dimensional memory structure 326 showing a cross-sectional view along line AA of FIG. 6B. This cross sectional view cuts through vertical columns 632 and 634 and region 630 (see FIG. 6B). The structure of FIG. 6C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or fewer than four dummy word line layers, and more or fewer than forty eight word line layers (e.g., 96 word line layers). Vertical columns 632 and 634 are depicted protruding through the drain side select layers, source side select layers, dummy word line layers and word line layers. In one embodiment, each vertical column comprises a NAND string. For example, vertical column 632 comprises NAND string 684. Below the vertical columns and the layers listed below is substrate 101, an insulating film 654 on the substrate, and source line SL. The NAND string of vertical column 632 has a source end at a bottom of the stack and a drain end at a top of the stack. As in agreement with FIG. 6B, FIG. 6C show vertical column 632 connected to Bit Line 614 via connector 617. Local interconnects 664 and 666 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

In some embodiments, the word lines are read sequentially, which means that the word lines are read either from low to high (e.g., WLL0 to WLL47) or from high to low (e.g., WLL47 to WLL0). It is not required to read the entire set of word lines when reading sequentially. Techniques are disclosed herein for providing compensation for interference caused by adjacent memory cells on target memory cells during a sequential read.

In some embodiments, the read of an individual word line is broken down into separate reads of sub-blocks. Referring again to FIG. 6B, the block is divided into four sub-blocks 620, 630, 640, 650. Thus, the four sub-blocks on one word line layer may be read, prior to reading the four sub-blocks on an adjacent word line layer. In some embodiments, data state information is used to provide compensation on a sub-block basis. For example, data state information for memory cells at WLL35 is kept for each of the four sub-blocks 620-650. Then, when reading sub-block 620 at WLL36 the data state information for sub-block 620 at WLL35 is used to compensate for interference from adjacent memory cells in sub-block 620 at WLL35, when reading sub-block 630 at WLL36 the data state information for sub-block 630 at WLL35 is used to compensate for interference from adjacent memory cells in sub-block 620 at WLL35, etc.

FIG. 6D depicts a cross sectional view of region 629 of FIG. 6C that includes a portion of vertical column 632. In one embodiment, the vertical columns are round and include four layers; however, in other embodiments more or less than four layers can be included and other shapes can be used. In one embodiment, vertical column 632 includes an inner core layer 670 that is made of a dielectric, such as $SiO_2$. Other materials can also be used. Surrounding inner core 670 is polysilicon channel 671. Materials other than polysilicon can also be used. Note that it is the channel 671 that connects to the bit line. Surrounding channel 671 is a tunneling dielectric 672. In one embodiment, tunneling dielectric 672 has an ONO structure. Surrounding tunneling dielectric 672 is charge trapping layer 673, such as (for example) Silicon Nitride. Other memory materials and structures can also be used. The technology described herein is not limited to any particular material or structure.

FIG. 6D depicts dielectric layers DLL49, DLL50, DLL51, DLL52 and DLL53, as well as word line layers WLL43, WLL44, WLL45, WLL46, and WLL47. Each of the word line layers includes a word line region 676 surrounded by an aluminum oxide layer 677, which is surrounded by a blocking oxide ($SiO_2$) layer 678. The physical interaction of the word line layers with the vertical column forms the memory cells. Thus, a memory cell, in one embodiment, comprises channel 671, tunneling dielectric 672, charge trapping layer 673, blocking oxide layer 678, aluminum oxide layer 677 and word line region 676. For example, word line layer WLL47 and a portion of vertical column 632 comprise a memory cell MC1. Word line layer WLL46 and a portion of vertical column 632 comprise a memory cell MC2. Word line layer WLL45 and a portion of vertical column 632 comprise a memory cell MC3. Word line layer WLL44 and a portion of vertical column 632 comprise a memory cell MC4. Word line layer WLL43 and a portion of vertical column 632 comprise a memory cell MC5. In other architectures, a memory cell may have a different structure; however, the memory cell would still be the storage unit.

Note that the charge trapping layer 673 may extend from one end of the NAND string to the other, and hence may be referred to herein as a continuous charge trapping layer. When a memory cell is programmed, electrons are stored in a portion of the charge trapping layer 673 which is associated with the memory cell. These electrons are drawn into the charge trapping layer 673 from the channel 671, through the tunneling dielectric 672, in response to an appropriate voltage on word line region 676. The Vt of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 7:
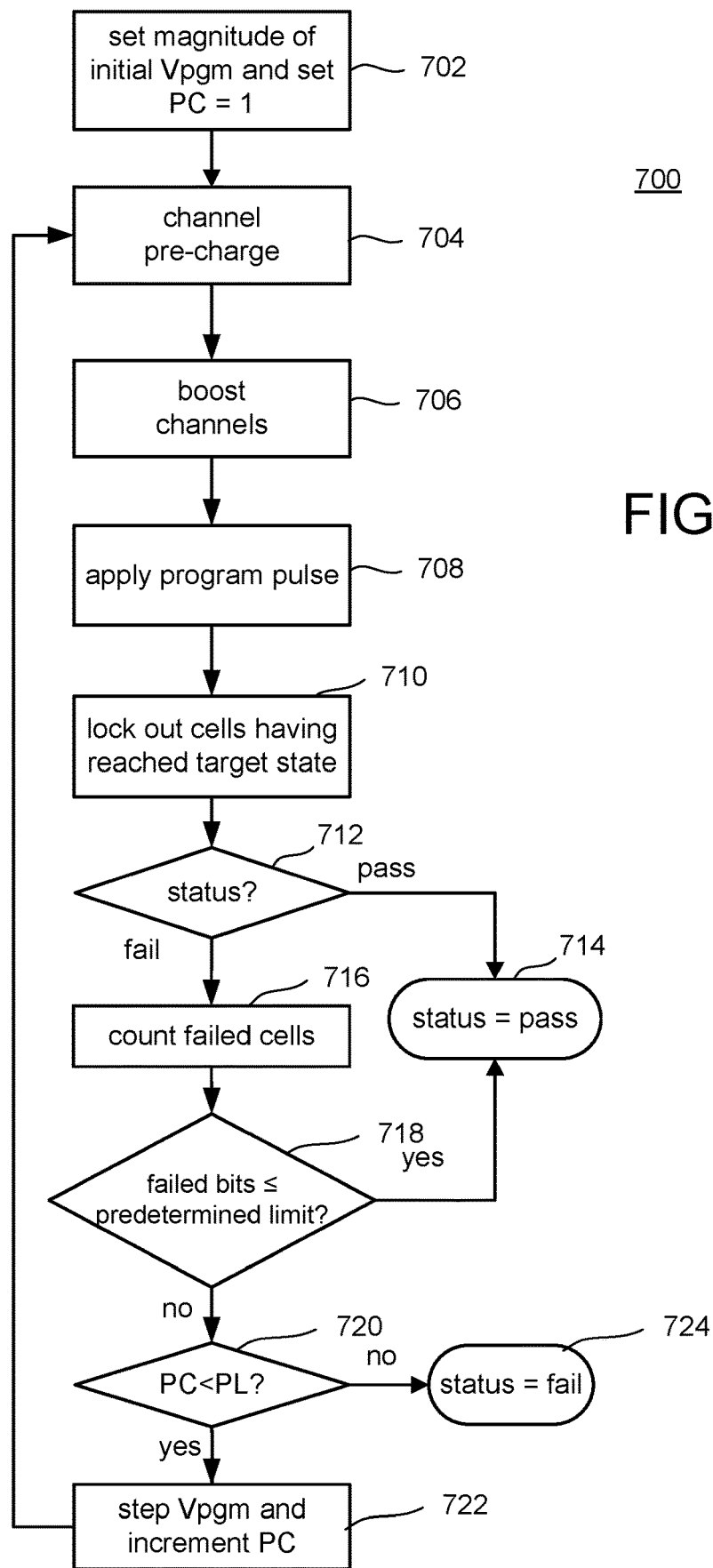
FIG. 7 is a flowchart describing one embodiment of a process for programming NAND strings of memory cells organized into an array.

FIG. 7 is a flowchart describing one embodiment of a process 700 for programming NAND strings of memory cells. The process of FIG. 7 can be performed at the direction of state machine 312. In one example embodiment, the process of FIG. 7 is performed on memory die 300 using the control circuitry 310 (and read/write circuits 328, as well as decoders 332/324) discussed above. In one example embodiment, the process of FIG. 7 is performed by integrated memory assembly 306 using the control circuitry 310 discussed above. The process includes multiple loops, each of which includes a program phase (e.g., steps 704-708) and a verify phase (e.g., steps 710-718).

In many implementations, the magnitude of the program pulses is increased with each successive pulse by a predetermined step size. In step 702 of FIG. 7, the programming voltage (Vpgm) is initialized to the starting magnitude (e.g., ~12-16V or another suitable level) and a program counter PC maintained by state machine 312 is initialized at 1.

In one embodiment, the set of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 704 the memory system will pre-charge channels of NAND strings that include memory cells connected to the selected word line that are to be inhibited from programming.

In one embodiment, step 704 is the start of a program operation. In some embodiments, different sets of memory cells are programmed concurrently. For example, programming of memory cells in different memory structures 326 may be performed concurrently. In some embodiments, the start of concurrent program operations (e.g., step 704) is staggered such that step 704 occurs at different times for the different memory structures 326.

In step 706, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 708, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 708, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their Vt change, unless they are inhibited from programming.

In step 710, memory cells that have reached their target states are locked out from further programming. Step 710 may include performing verifying at one or more verify reference levels. In one embodiment, the verification process is performed by testing whether the threshold voltages of the memory cells selected for programming have reached the appropriate verify reference voltage.

In step 710, a memory cell may be locked out after the memory cell has been verified (by a test of the Vt) that the memory cell has reached its target state. Note that if the sensing of the memory cell Vt is inaccurate, then the memory cell may be locked out either too early or too late. Technology disclosed herein improves sensing accuracy to help prevent locking out either too early or too late. In some architectures, a memory cell in a block that is far from the sense amplifier could potentially be falsely sensed as non-conductive, and therefore locked out too early. Locking out memory cells too early can lead to spread of the lower tail of a Vt distribution, which is discussed in more detail below. In some embodiments, the sense node is charged to a lower voltage when verifying memory cells in block far from the sense amplifier, which improves sensing accuracy (e.g., memory cells are not prematurely locked out). Moreover, spread of the lower tail of a Vt distribution is reduced. Hence, Vt margin is improved.

If, in step 712, it is determined that all of the memory cells have reached their target threshold voltages (pass), the programming process is complete and successful because all selected memory cells were programmed and verified to their target states. A status of "PASS" is reported in step 714. Otherwise if, in step 712, it is determined that not all of the memory cells have reached their target threshold voltages (fail), then the programming process continues to step 716.

In step 716, the memory system counts the number of memory cells that have not yet reached their respective target Vt distribution. That is, the system counts the number of memory cells that have, so far, failed to reach their target state. This counting can be done by the state machine 312, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 718, it is determined whether the count from step 716 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 714. In this situation, enough memory cells programmed correctly such that the few remaining memory cells that have not been completely programmed can be corrected using ECC during the read process. In some embodiments, the predetermined limit used in step 718 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 720 and the program counter PC is checked against the program limit value (PL). Examples of program limit values include 1, 12, 16, 19 and 30; however, other values can be used. If the program counter PC is not less than the program limit value PL, then the program process is considered to have failed and a status of FAIL is reported in step 724. If the program counter PC is less than the program limit value PL, then the process continues at step 722 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 722, the process loops back to step 704 and another program pulse is applied to the selected word line so that another iteration (steps 704-722) of the programming process of FIG. 7 is performed.

At the end of a successful programming process, the threshold voltages of the memory cells should be within one or more distributions of threshold voltages for programmed memory cells or within a distribution of threshold voltages for erased memory cells, as appropriate. FIG. 8A illustrates example Vt distributions for the memory array when each memory cell stores three bits of data. Other embodiments, however, may use other data capacities per memory cell (e.g., such as one, two, four, or five bits of data per memory cell). FIG. 8A shows eight Vt distributions, corresponding to eight data states. The first Vt distribution S0 represents memory cells that are erased. State S0 may be referred to herein as an erase state (Er State). The other seven Vt distributions S1-S7 represent memory cells that are programmed and, therefore, may be called programmed states. Each Vt distribution (data state) corresponds to predetermined values for the set of data bits. The specific relationship between the data programmed into the memory cell and the Vt levels of the cell depends upon the data encoding scheme adopted for the cells. In one embodiment, data values are assigned to the Vt ranges using a Gray code assignment so that if the Vt of a memory erroneously shifts to its neighboring physical state, only one bit will be affected.

FIG. 8A shows eight Vt distributions (S0-S7). FIG. 8A also shows seven read reference voltages, Vr1, Vr2, Vr3, Vr4, Vr5, Vr6, and Vr7 for reading data from memory cells. By testing (e.g., performing sense operations) whether the Vt of a given memory cell is above or below the seven read reference voltages, the system can determine what data state (i.e., S0, S1, S2, S3, . . . ) a memory cell is in.

FIG. 8A also shows seven verify reference voltages, Vv1, Vv2, Vv3, Vv4, Vv5, Vv6, and Vv7. In some embodiments, when programming memory cells to data state S1, the system will test whether those memory cells have a Vt greater than or equal to Vv1. When programming memory cells to data state S2, the system will test whether the memory cells have threshold voltages greater than or equal to Vv2. When programming memory cells to data state S3, the system will determine whether memory cells have their Vt greater than or equal to Vv3. When programming memory cells to data state S4, the system will test whether those memory cells have a Vt greater than or equal to Vv4. When programming memory cells to data state S5, the system will test whether those memory cells have a Vt greater than or equal to Vv5. When programming memory cells to data state S6, the system will test whether those memory cells have a Vt greater than or equal to Vv6. When programming memory cells to data state S7, the system will test whether those memory cells have a Vt greater than or equal to Vv7. The programmed state (e.g., S1) that is verified by the lowest magnitude reference voltage (e.g., Vv1) is referred to herein as the "lowest programmed state." The programmed state (e.g., S7) that is verified by the highest magnitude reference voltage (e.g., Vv7) is referred to herein as the "highest programmed state."

FIG. 8A also shows Vev (for an "erase verify voltage"), which is a voltage level to test whether a memory cell has been properly erased. As depicted in FIG. 8A, a memory cell that is erased should have a Vt below Vev. In general, during verify operations and read operations, the selected word line is connected to a voltage, a level of which is specified for each read operation (e.g., see read compare levels Vr1, Vr2, Vr3, Vr4, Vr5, Vr6, and Vr7, of FIG. 8A) or verify operation (e.g. see verify target levels Vv1, Vv2, Vv3, Vv4, Vv5, Vv6, and Vv7 of FIG. 8A) in order to determine whether a Vt of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the Vt of the memory cell. If the conduction current is not measured to be greater than the certain value, then it is assumed that the memory cell did not turn on and the voltage applied to the word line is not greater than the Vt of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

FIG. 8B shows the eight Vt distributions (S0-S7) from FIG. 8A, but shows some spreading of the Vt distributions. Hence, there may be some overlap between two adjacent Vt distributions. This overlap may cause memory cells to be read as being in the incorrect state. The aforementioned ECC can be used to correct a certain number of such errors. However, the process of correcting such errors can consume additional time and/or power. In general, the more errors there are to correct, the more time and power will be used. In some cases, there may be too many errors for corrected using the ECC. In this case, the data can still be reconstructed using techniques such as an XOR stripe.

Figure 9:
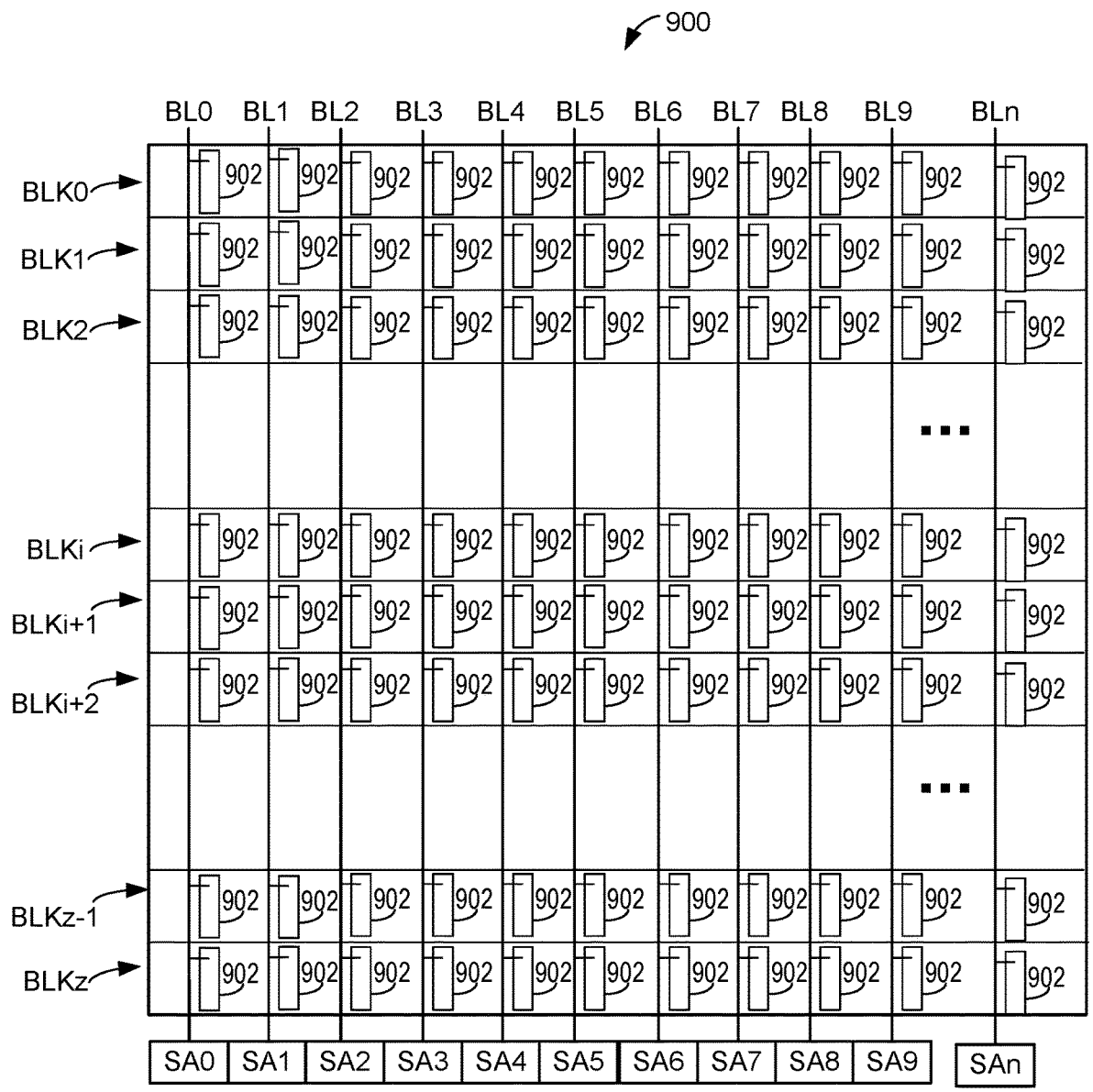
FIG. 9 is a diagram of plane that contains blocks (BLK) of non-volatile memory cells.

FIG. 9 is a diagram of plane 900 that contains blocks (BLK) of non-volatile memory cells. In this example, there are "z+1" blocks. Because there may be a large number of blocks in a plane, not all blocks are depicted. There may be many blocks between BLK2 and BLKi, as indicated by the gap between those blocks. Likewise, there may be many blocks between BLKi+2 and BLKz−1, as indicated by the gap between those blocks. Each block contains a number of NAND strings 902.

There are "n+1" bit lines (BL0, BL1, BLn). There may be many bit lines between BL9 and BLn, as indicated by the gap between those bit lines. Each NAND string 902 is connectable to one of the bit lines. With brief reference to FIG. 6C, SGD transistor may be used to connect a NAND string to a bit line. Each of the bit lines is connectable to a NAND string in different blocks. For sensing operations, a bit line is typically connected to one NAND string at a time. For a read or verify operation, one of the blocks is selected. The bit lines are thus connected to the respective NAND string in the selected block. The other blocks are referred to as unselected blocks. In some embodiments, the bit lines are not connected to NAND strings in unselected blocks during read or verify operations.

There is a sense amplifier (SA0, SA1, SAn) associated with each bit line. For example, sense amplifier SA0 is associated with bit line BL0. Each sense amplifier is able to provide a voltage to the bit line to which it is associated. It is possible for the voltage of a bit line when the memory cell is being sensed to be somewhat different at the connection points to the bit line's respective NAND strings, even if the voltage is the same at the sense amplifier. A possible reason for this difference is due to IR drop along the bit line. Herein, IR drop refers to the drop in voltage due to a current flowing through a resistive element. A memory cell current may flow through the bit line when the memory cell is sensed. The bit line resistance is normally quite low, but there will be some BL resistance. Hence, there could be a block to block variation of the bit line voltage (at the selected NAND string) during read or verify operations. Note that there could also be some BL voltage variation (at the selected NAND string) even within the same selected block if the resistance of the section of the bit lines between the SA and the selected block differs from each other. For example, one of the bit lines could have an abnormally high resistance per unit length.

Each sense amplifier contains a sense node. In an embodiment, each sense amplifier charges its sense node to a sense voltage having a magnitude that depends on the distance to the block containing the selected memory cell presently being sensed. In some embodiments, the sense node is charged to a sense voltage having a magnitude that depends on the distance between the selected NAND string and the sense amplifier. Each sense amplifier then connects its sense node to its bit line (while a reference voltage is applied to the selected memory cell) to allow a memory cell current (if any) to discharge the sense node for an integration time. Thus, variations in bit line voltage (at the selected NAND string) are mitigated.

In an embodiment, each sense amplifier charges its sense node to a sense voltage having a magnitude that depends on the bit line resistance between the sense amplifier and the selected NAND string. Each sense amplifier then connects its sense node to its bit line (while a reference voltage is applied to the selected memory cell) to allow a memory cell current (if any) to discharge the sense node for an integration time. Thus, variations in bit line resistances between the sense amplifier and the selected NAND string are mitigated. Moreover, variations in bit line voltage (at the selected NAND string) are mitigated. Note that in one embodiment, the sense nodes are charged to a voltage that depends on BL resistance to overcome issues for different BL resistances between the SAs and NAND strings in the same block. However, in other embodiments, the sense nodes are charged to a voltage that depends on BL resistance to overcome issues for different BL resistances between the SAs and NAND strings in different blocks.

There are other possible locations for the sense amplifiers than the example depicted in FIG. 9. Similar issues with variances in bit line voltage at the selected NAND strings may occur with other sense amplifier locations. Hence, embodiments in which the sense node is charged to a sense voltage having a magnitude that depends on the distance between the selected NAND string and the sense amplifier are not limited to the sense amplifier locations depicted in FIG. 9. Likewise, embodiments in which the sense node is charged to a sense voltage having a magnitude that depends on the bit line resistance between the selected NAND string and the sense amplifier are not limited to the sense amplifier locations depicted in FIG. 9. Likewise, embodiments in which the sense node is charged to a sense voltage having a magnitude that depends on the bit line voltage at the selected NAND string are not limited to the sense amplifier locations depicted in FIG. 9.

Figure 10:
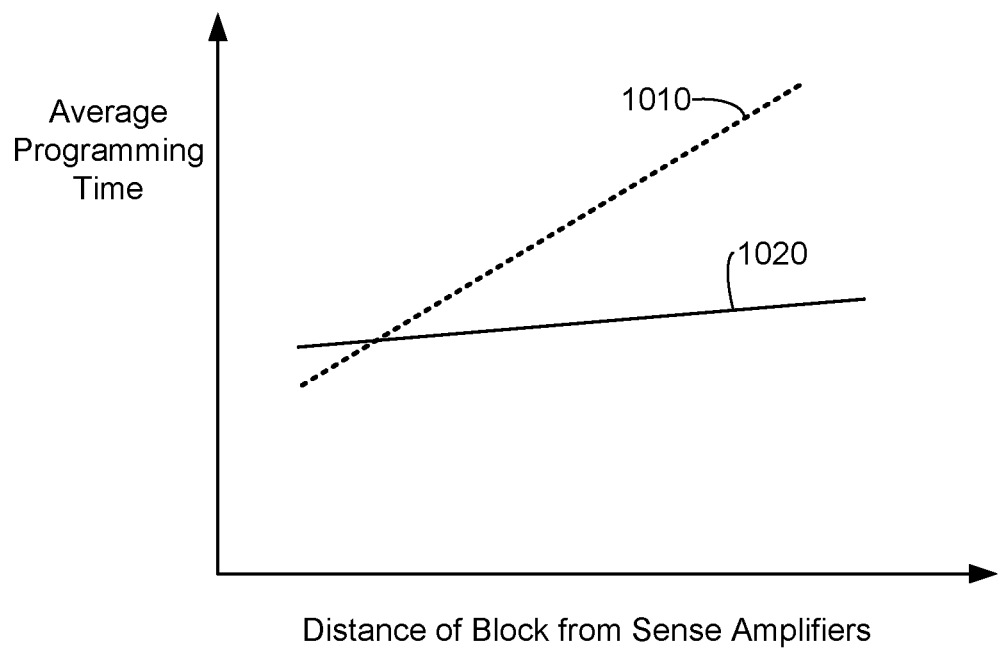
FIG. 10 is a graph of average programming time versus distance of a block from the sense amplifiers.

Selecting a suitable sense voltage for the sense node, as disclosed herein, may improve average programming time. FIG. 10 is a graph of average programming time versus distance of a block from the sense amplifiers. As discussed above, a programming operation includes applying a program pulse to the memory cells, followed by a verify operation. If the sensing accuracy during the verify operation lacks accuracy, then the programming time may be inconsistent and/or increased. A possible reason for this is that memory cells could be locked out too early or too late (see step 710 in FIG. 7). Average programming time may alternatively be expressed as average number of program loops.

Plot 1010 in FIG. 10 represents an example in which the sense node is charged to the same voltage during program verify regardless of block location. The average programming time may increase significantly for programming of memory cells in blocks that are further from the sense amplifiers. Moreover, the average programming time varies considerable, depending on block location. Having a large variance in average programming time may be undesirable.

Plot 1020 in FIG. 10 represents an embodiment in which the sense node is charged to different voltages during program verify depending on block location. The average programming time is about the same for all blocks. Moreover, the programming time for blocks located further from the sense amplifiers is considerably improved relative to plot 1010.

Figure 11:
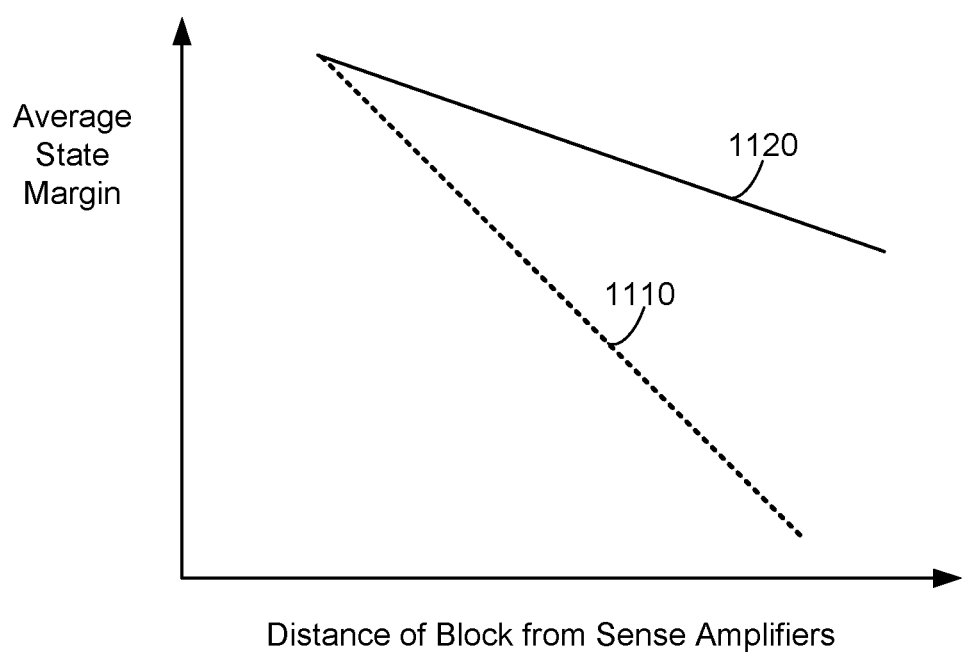
FIG. 11 is a graph of average state margin versus distance of a block from the sense amplifiers.

FIG. 11 is a graph of average state margin versus distance of a block from the sense amplifiers. The state margin refers to the separation between Vt distributions and may also be referred to as Vt margin. It is desirable to have a larger state margin (e.g., larger separation between Vt distributions). A larger state margin correlates with a lower bit error rate (BER).

Plot 1110 represents average state margin versus distance of a block from the sense amplifiers for an example in which the sense nodes are charged to the same voltage during read or verify operations, regardless of block location. The average state margin drops considerably as the distance to the sense amplifiers increases. A possible reason for this drop is that the bit line voltage (at the NAND string) may be lower for blocks farther from the sense amplifiers. This lower bit line voltage can lead to inaccurate sensing.

Plot 1120 represents average state margin versus distance of a block from the sense amplifiers for an embodiment in which the sense nodes are charged to a voltage during read or verify operations that depends on block location. The average state margin is much better than the example in which the sense nodes are charged to the same voltage during read or verify operations, regardless of block location. Moreover, the average state margin for plot 1120 is much more consistent between blocks than for plot 1110.

Figure 12:
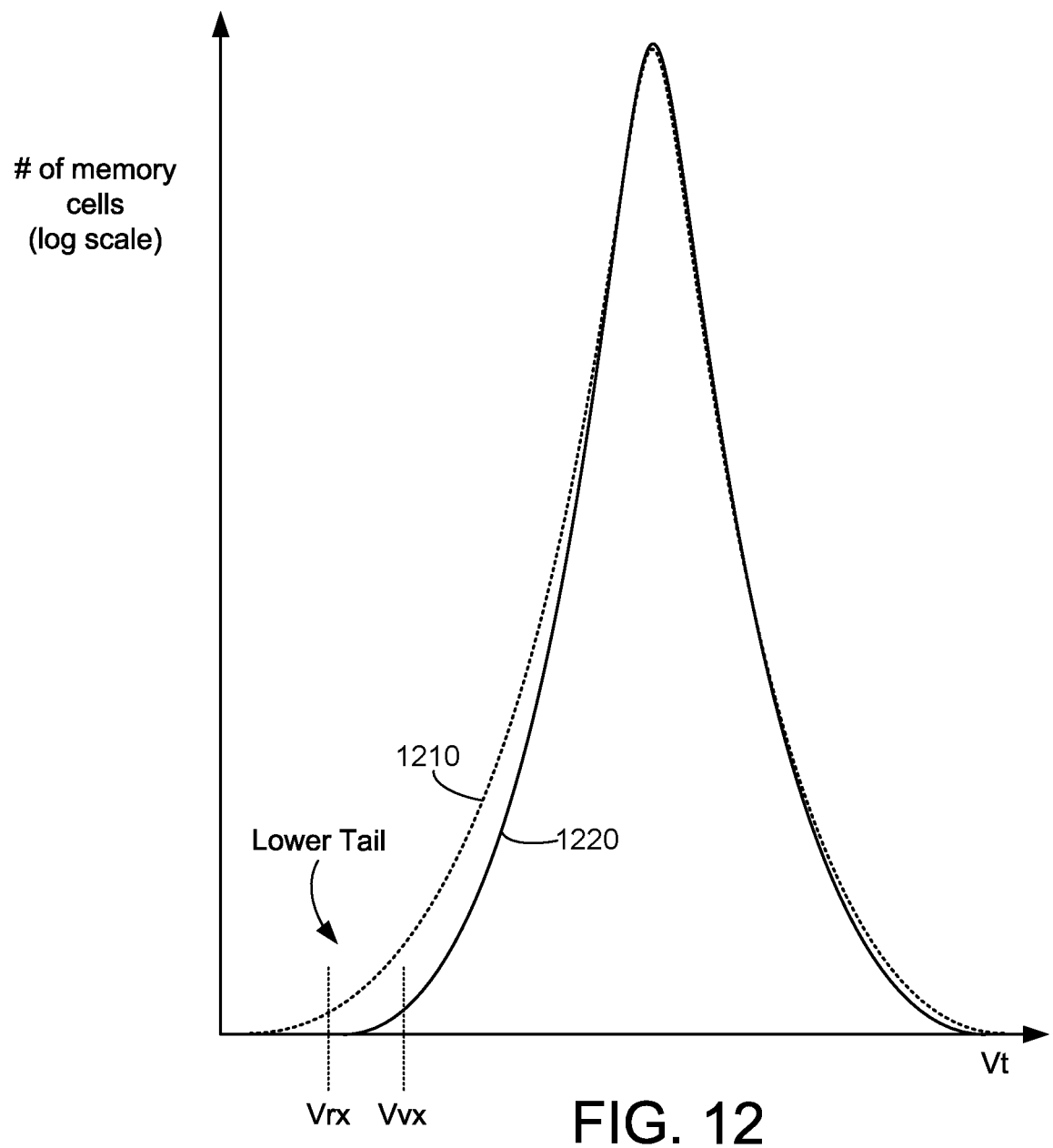
FIG. 12 depicts two Vt distributions to illustrate the concept of lower tail spreading.

A factor in the improved state margin is reduction in lower tail spreading, which is achieved in embodiments having block location dependent sense node voltages. FIG. 12 depicts two Vt distributions to illustrate the concept of lower tail spreading. The dashed line Vt distribution 1210 represents an example in which the same sense node voltage is used regardless of block location. The solid line Vt distribution 1220 represents an example in which the magnitude of the sense node voltage depends on block location. For example, the sense node may be charged to a lower voltage when the block is further from the sense amplifier.

The Vt distributions 1210, 1220 are for the same state, which could be any programmed state. A verify voltage Vvx and a read reference voltage Vrx are depicted near the lower tail of the Vt distributions 1210, 1220. The lower tail of Vt distribution 1210 shows considerable spread in that many of the memory cells in Vt distribution 1210 have Vt below Vrx. A possible reason for the lower tail spread is under-programming of memory cells due to inaccurate sensing during verify. However, by charging the sense node to a voltage that depends on block location, the lower tail spread is reduced. Therefore, the margin between Vt distribution 1220 and the adjacent Vt distribution below (not depicted in FIG. 12) is improved. Hence, BER is improved. Although the discussion of FIGS. 10-12 was in the context of block location, other factors such as differences in bit line resistance may also lead to issues with state margin and programming time.

Figure 13:
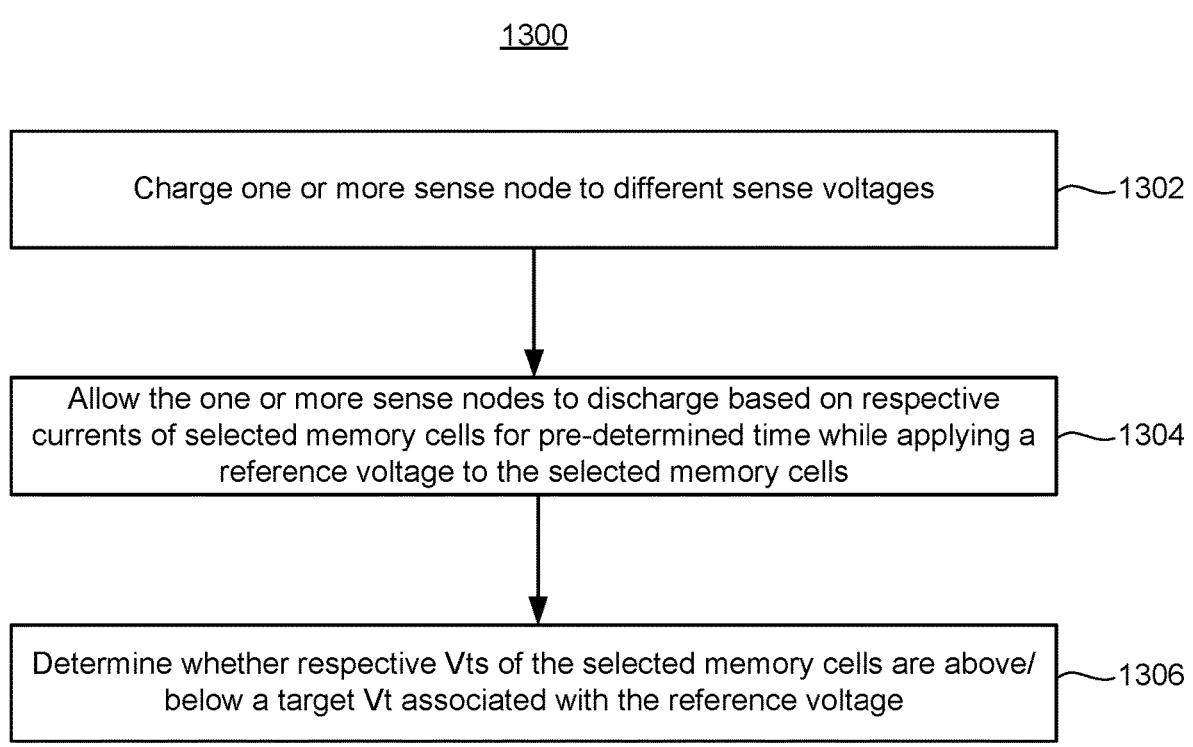
FIG. 13 is a flowchart of one embodiment of a process of sensing memory cells.

FIG. 13 is a flowchart of one embodiment of a process 1300 of sensing memory cells. The process may be used to read or verify memory cells. In one embodiment, process 1300 is used to sense a first selected memory cell in one block at one point in time, and to sense a second selected memory cell in another block at another point in time. The first and second selected memory cells may be sensed using the same sense node, but at the aforementioned different times. In one embodiment, process 1300 is used to sense two selected memory cells in the same block at the same time. In this case, the two selected memory cell are sensed using different sense nodes.

Step 1302 includes charging one or more sense nodes to different sense voltages. The different sense voltages have corresponding different magnitudes. For example, there may be a high magnitude and a low magnitude. As another example, there may be a high, medium, and low magnitudes. More than three different magnitudes could be used. In one embodiment, step 1302 includes applying the different sense voltages to the same sense node at different times. In one embodiment, step 1302 includes applying the different sense voltages to different sense nodes at the same time. In one embodiment, the magnitude of the sense voltage varies inversely with a distance between the sense node and a selected block. For example, a higher magnitude sense voltage is used for a shorter distance, and a lower sense voltage is used for a longer distance. In one embodiment, the magnitude of the sense voltage depends on a location of the block having the selected memory cell. In one embodiment, the magnitude of the sense voltage depends on resistance of a bit line associated with the sense node (and hence the selected memory cell). For example, the magnitude of the sense voltage may vary inversely with bit line resistance.

Step 1304 includes allowing the one or more sense nodes to discharge based on respective currents of selected memory cells for a pre-determined time (e.g., integration time) while applying a reference voltage to the selected memory cells. In an embodiment in which step 1302 includes applying the different sense voltages to the same sense node at different times, step 1304 includes applying the reference voltage to the selected memory cells at the different times. In an embodiment in which step 1302 includes applying the different sense voltages to different sense nodes at the same time, step 1304 includes applying the reference voltage to the selected memory cells at the same time. In one embodiment, the reference voltage is a read reference voltage. In one embodiment, the reference voltage is a verify reference voltage. FIG. 8A depicts examples of read reference voltages and verify reference voltages. Each of the reference voltages is associated with a target Vt, as depicted by the location of the reference voltage along the Vt axis.

Step 1306 includes determining whether respective Vts of the selected memory cells are above or below a target Vt associated with the reference voltage. This determination is made after the one or more sense nodes have discharged for the pre-determined time. Note that step 1306 tests the selected memory cells for the same target Vt. For example, the target Vt could be Vv4 for a verify operation, or Vr4 for a read operation.

Figure 14:
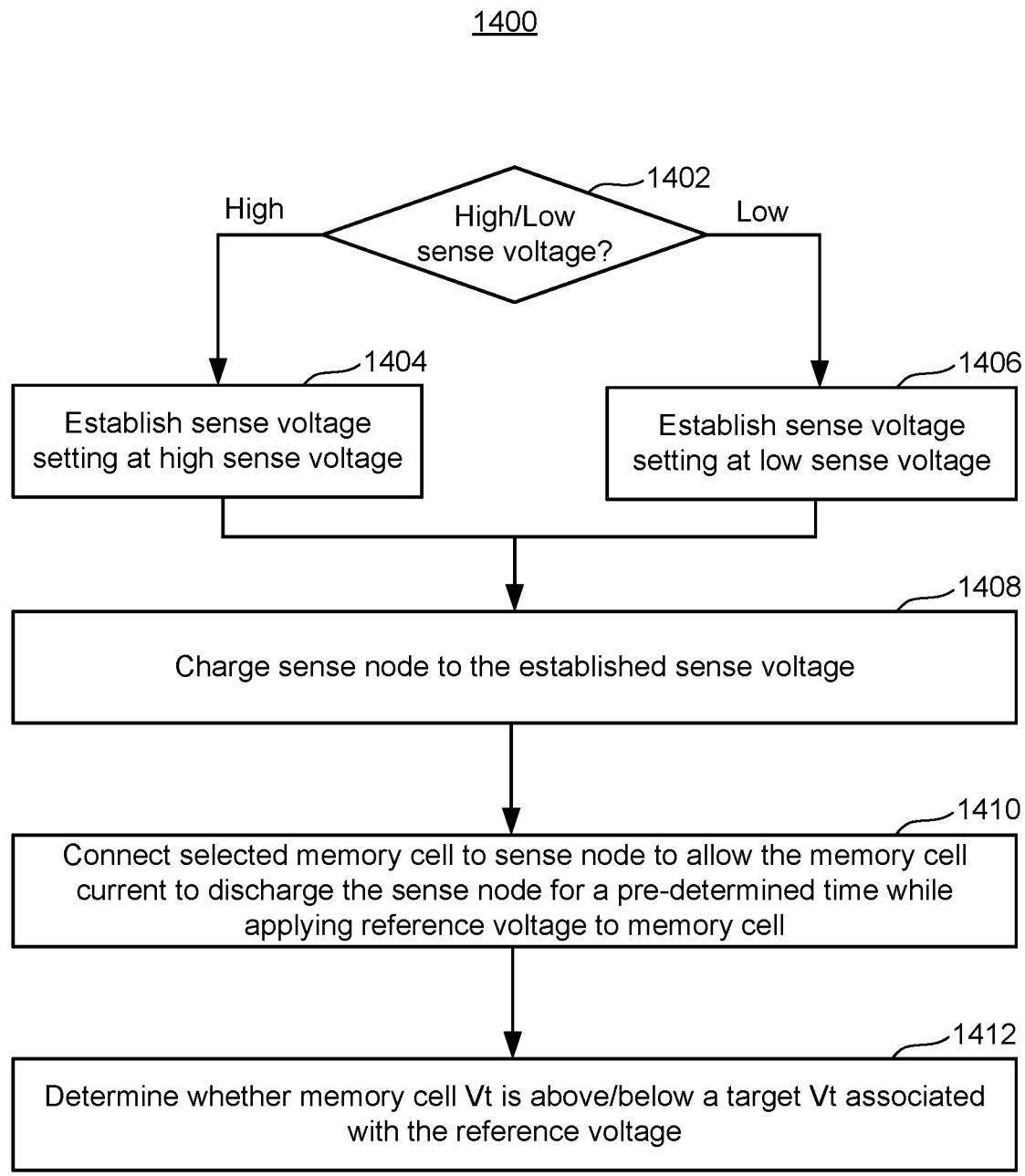
FIG. 14 is a flowchart of one embodiment of a process of sensing memory cells in which a sense node is charged to different sense voltages when sensing different memory cells.

As noted in the discussion of process 1300, in some embodiments, the same sense node is charged to different sense voltages to sense different memory cells at different times. As noted above, the different sense voltages have different magnitudes. FIG. 14 is a flowchart of one embodiment of a process 1400 of sensing memory cells in which a sense node is charged to different sense voltages when sensing different memory cells. Process 1400 provides further details for one embodiment of process 1300.

Step 1402 includes a determination of whether a high or low magnitude sense voltage is to be used. In one embodiment, this determination is based on the location of the selected block. In one embodiment, this determination is based on the distance between the selected memory cell (or selected NAND string) and the sense amplifier containing the sense node. In one embodiment, this determination is based on the expected bit line voltage at the connection to the selected NAND string when the memory cell is connected to the sense node. In one embodiment, this determination is based on the bit line resistance between the selected NAND string and the sense amplifier. In one embodiment, the low magnitude sense voltage is used when: the distance between the selected block and the SA is above a defined distance, the distance between the selected memory cell (or selected NAND string) and the SA is above a defined distance, the expected BL voltage at the selected NAND string is below a defined voltage, and/or the BL resistance between the selected NAND string and the SA is above a defined resistance. Otherwise, the high magnitude sense voltage may be used.

If the determination is to use a high magnitude sense voltage, then the sense voltage is established at a high level, in step 1404. If the determination is to use a low magnitude sense voltage, then the sense voltage is established at a low level, in step 1406. The process 1400 can be expanded to include more than two different magnitudes for sense voltage. For example, with three different magnitudes for the sense voltage, a high magnitude sense voltage may be used when the distance between the selected block and the SA is below a first length, a medium magnitude sense voltage may be used when the distance is between the first length and a second length, and a low magnitude sense voltage may be used when the distance is greater than the second length (where the second length is longer than the first length).

Step 1408 includes charging the sense node to the established sense voltage. When step 1408 is performed at different times for the high and low magnitude sense voltages, this is one embodiment of step 1302 of process 1300.

Step 1410 includes connecting the selected memory cell to the sense node to allow the memory cell current to discharge the sense node for a pre-determined time, while applying a reference voltage to the memory cell. When step 1410 is performed at different times for the high and low magnitude sense voltages, this is one embodiment of step 1304 of process 1300.

Step 1412 includes determining whether the memory cell Vt is above or below a target Vt associated with the reference voltage. When step 1412 is performed at different times for the high and low magnitude sense voltages, this is one embodiment of step 1306 of process 1300.

The process 1400 may later be repeated for another selected memory cell, in a different block. Depending on the result of step 1402, at some point the memory system will use the low magnitude sense voltage, and at some point the memory system will use the high magnitude sense voltage.

Figure 15:
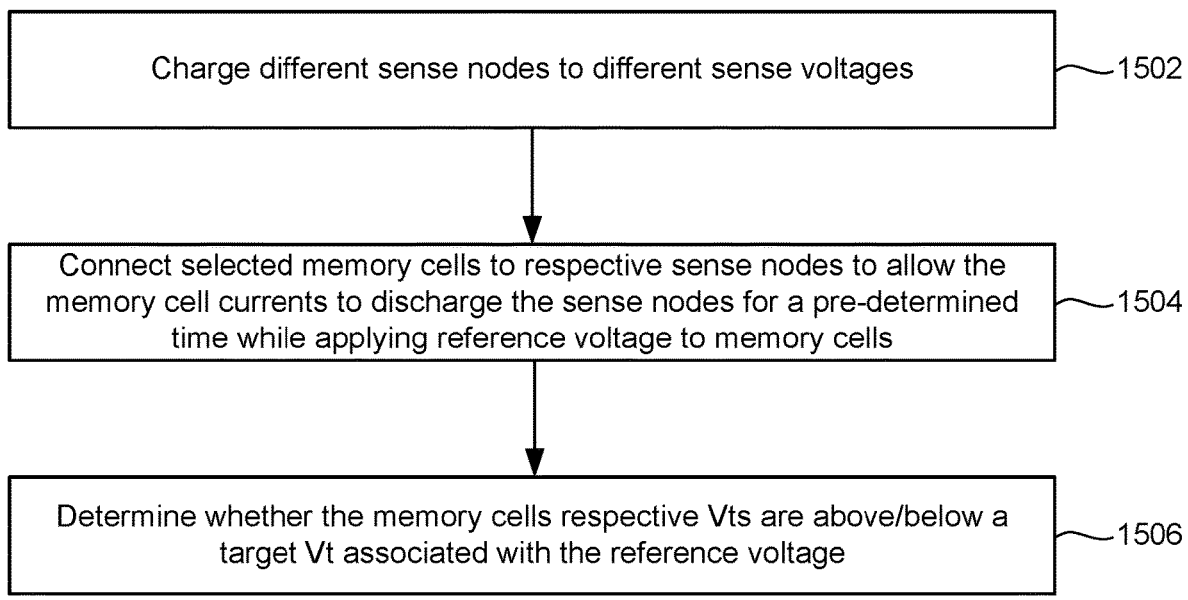
FIG. 15 is a flowchart of one embodiment of a process of sensing memory cells in which different sense nodes are charged to different sense voltages when sensing different memory cells.

As noted in the discussion of process 1300, in some embodiments, different sense nodes are charged to different sense voltages to sense different memory cells at the same time. FIG. 15 is a flowchart of one embodiment of a process 1500 of sensing memory cells in which different sense nodes are charged to different sense voltages when sensing different memory cells. As noted above, the different sense voltages have corresponding different magnitudes. Process 1500 provides further details for one embodiment of process 1300.

Step 1502 includes charging the different sense nodes to the different sense voltages. For example, one sense node is charge to a high magnitude sense voltage, and another sense node is charge to a low magnitude sense voltage. This charging may occur at the same time. Step 1502 is one embodiment of step 1302 of process 1300.

Step 1504 includes connecting the selected memory cells to their respective sense nodes to allow the respective memory cell currents to discharge the sense nodes for a pre-determined time, while applying a reference voltage to the selected memory cells. Step 1504 one embodiment of step 1304 of process 1300.

Step 1506 includes determining whether the selected memory cells' Vt is above or below a target Vt associated with the reference voltage. Step 1506 is one embodiment of step 1306 of process 1300.

Figure 16:
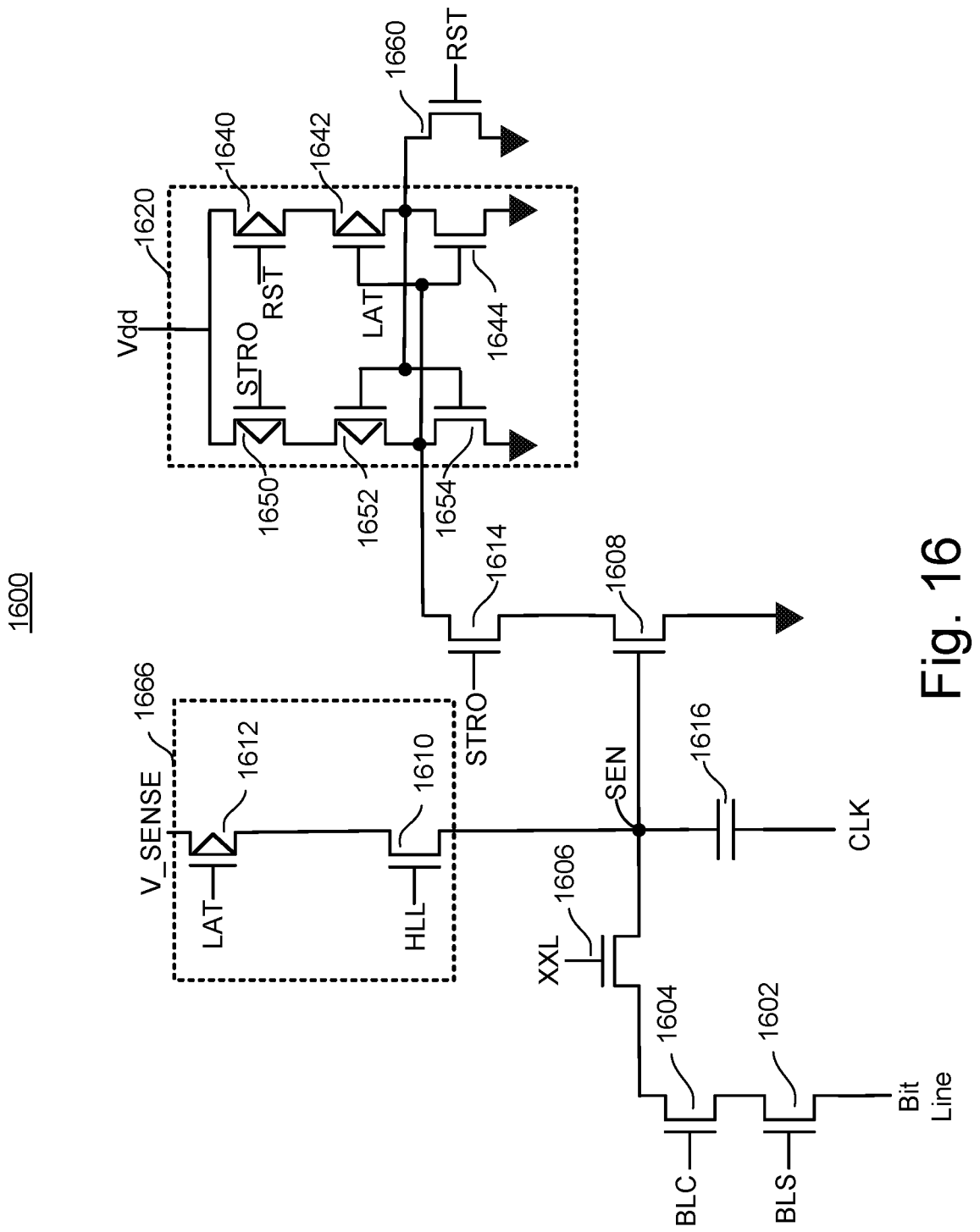
FIG. 16 is a schematic diagram depicting one embodiment sense circuitry.

FIG. 16 is a schematic diagram depicting one embodiment sense circuitry 1600. The sense circuitry 1600 could be used during process 1300, 1400, 1500, as well as process 1900 or 2000 described below. Sense circuitry 1600 may be used in one embodiment of sense circuits 350. As described below, the sense circuitry 1600 will charge a capacitor (or other charge storage device) to a sense voltage, discharge the capacitor by connecting the memory cell to the capacitor for a sensing time, and sense the voltage at the capacitor after the sensing time. Though FIG. 16 features one capacitor 1616, in some embodiments, any suitable charge storage device can replace or complement this capacitor 1616. The sense voltage will be indicative of whether the memory cell conducted the current being sensed for, which is indicative of whether the Vt of the memory cell is greater than or less than the target Vt being tested for. The capacitor 1616 may be used in sense node 464 (see FIG. 4).

FIG. 16 shows transistor 1602 connected to the Bit Line and transistor 1604. Transistor 1602 receives the signal BLS at its gate, and is used to connect to or isolate the Bit Line. Transistor 1604 receives the signal BLC at its gate, and is used as a voltage clamp. The gate voltage BLC is biased at a constant voltage equal to the desired Bit Line voltage plus the threshold voltage of transistor 1604. The function of transistor 1604, therefore, is to maintain a constant Bit Line voltage during a sensing operation (during read or verify), even if the current through the Bit Line changes. However, due to differences in BL resistance between BLS transistor 1602 and different selected NAND strings, the bit line voltage at the selected NAND strings could different from one another. Techniques disclosed herein overcome such voltage differences by charging the capacitor 1616 to a suitable voltage.

Transistor 1604 is connected to transistor 1606. Transistor 1606 is connected to capacitor 1616. The purpose of transistor 1606 is to connect capacitor 1616 to the Bit Line and disconnect capacitor 1616 from the Bit Line so that capacitor 1616 is in selective communication with Bit Line. In other words, transistor 1606 regulates the integration time (also referred to as the sensing time). That is, while transistor 1606 is turned on capacitor 1616 can discharge through the Bit Line, and when transistor 1606 is turned off capacitor 1616 cannot discharge through the Bit Line.

The SEN node at which transistor 1606 connects to capacitor 1616 is also connected to the gate of sensing transistor 1608. Thus, the upper plate of capacitor 1616 is connected to the gate of sensing transistor 1608. The lower plate of capacitor 1616 is connected to clock signal CLK. Optionally, a clock signal CLK may be used to raise or lower the voltage on the capacitor 1616, and hence raise or lower the voltage on the sense node SEN.

The SEN node is also connected to transistor 1610, which is connected to transistor 1612. Both transistor 1610 and 1612 are in a charge circuit 1666. The signal HLL is provided to the gate of transistor 1610. The signal LAT is provided to the gate of transistor 1612. A purpose of transistors 1610 and 1612 is to charge the sense node SEN. A voltage (e.g. V_SENSE or other voltage) is applied to the source of transistor 1612. By appropriately biasing transistors 1612 and 1610, the voltage applied to the source of transistor 1612 can be used to charge capacitor 1616. In some embodiments, the magnitude of the voltage on the sense node (SEN) is controlled by the magnitude of V_SENSE. After charging, capacitor 1616 can discharge through the Bit Line via transistor 1606 (assuming that transistors 1602 and 1604 are conducting).

The drain of sense transistor 1608 is connected to a strobe transistor 1614. The gate of the strobe transistor 1614 is provide with a strobe signal STRO. A purpose of the strobe transistor 1614 is to connect the sensing transistor 1608 to the latch circuit 1620.

The latch circuit 1620 includes transistors 1640, 1642, 1644, 1650, 1652, and 1654. Transistor 1650 receives the strobe signal STRO at its gate. Transistor 1640 receives a reset signal RST at its gate. The gates of transistors 1652 and 1654 are tied together. The LAT voltage in the data latch 1620 represents a condition of the memory cell. In one embodiment, LAT will be high if the memory cell has a Vt at or above the reference level and low if the memory cell has a Vt below the reference level. Thus, a high LAT means that the memory cell has a Vt at or above the reference level, in one embodiment. Thus, a low LAT means that the memory cell has a Vt below the reference level, in one embodiment.

A reset transistor 1660 is connected to the gates of transistors 1652 and 1654. The gate of reset transistor 1660 is provided with the reset signal RST. Thus, the reset signal RST may be used to reset the latch 1620.

Note that although only one latch circuit 1620 is depicted in FIG. 16, sense circuitry 1600 may have two or more latch circuits 1620. In this case, the sense circuitry 1600 may be configured to store results in a selected latch circuit 1620.

As discussed above, capacitor 1616 is charged via transistors 1610 and 1612. This will raise the voltage at the node SEN to a charge voltage level (V_SENSE). When transistor 1606 turns on, capacitor 1616 can discharge its charge through the Bit Line and the selected memory cell if the Vt of the memory cell is below the target Vt being tested for. If the capacitor 1616 is able to discharge, then the voltage at the capacitor (at the SEN node) will decrease.

The charge voltage (V_SENSE) at the SEN node is greater than the Vt of transistor 1608; therefore, prior to the sense time, transistor 1608 is on (conducting). Since transistor 1608 is on during the sense time, then transistor 1614 should be off. If the capacitor 1616 does not discharge during the sense time, then the voltage at the SEN node will remain above the Vt of transistor 1608. With the sense transistor 1608 on and transistor 1614 on LAT in the data latch 1620 goes high, in one embodiment.

If the capacitor 1616 discharges sufficiently during the sense time, then the voltage at the SEN node will decrease below the Vt of transistor 1608, thereby turning off transistor 1608. In this case, LAT in the data latch 1620 will be low, in one embodiment. The voltage at LAT in the data latch 1620 may be provided to managing circuitry outside of the sense circuitry 1600. In one embodiment, a compliment of the voltage at LAT in the data latch 1620 is provided to managing circuit 480 outside of the sense circuitry 1600. Thus, the condition of the memory cell with respect to a reference level (e.g., threshold voltage) may be determined by the sense circuitry 1600 and/or by managing circuit 480 outside of the sense circuitry 1600.

Figure 17:
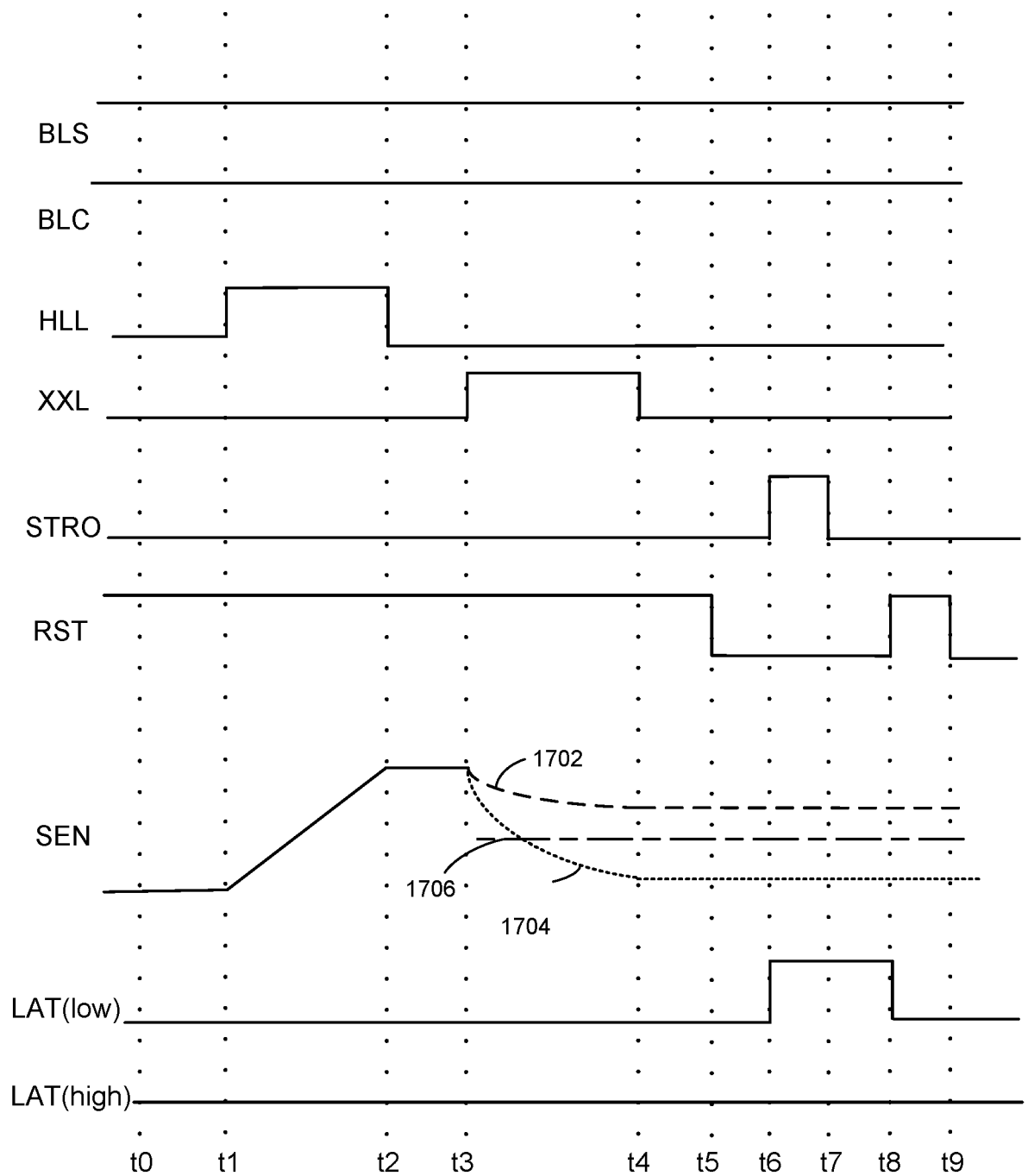
FIG. 17 is a diagram that shows timing of various signals for one embodiment of sensing using the sense circuitry.

FIG. 17 is a diagram that shows timing of various signals for one embodiment of sensing using the sense circuitry 1600. Between time t1 and t2, HLL is high and LAT is low. These conditions turn on both transistors 1612 and 1610, connecting the top plate of the capacitor 1616 to V_SENSE (or some other voltage). At time t2, HLL goes low, which turns off transistor 1610 to stop the charging of SEN. At time t2, the voltage at SEN is at the sense voltage V_SENSE. In some embodiments, the magnitude of the voltage at SEN is controlled by selecting a suitable magnitude for V_SENSE (applied to transistor 1612). In one embodiment, the magnitude of the voltage at SEN is controlled by controlling the time for which HLL is high (e.g., the time between t1 and t2).

XXL is brought high at t3 and returned low at t4. The time between t3 and t4 is referred to as an integration time or a sensing time. XXL is provided to the gate of transistor 1606, thus turning on transistor 1606. Also, transistors 1602 and 1604 are on at this time. This connects the sense node SEN to the bit line. Hence, the memory cell current may discharge SEN.

Therefore, the capacitor 1616 is allowed to discharge its charge through the bit line and NAND string (including the selected memory cell being sensed). Between t3 and t4, the sense node SEN discharges. Two different discharge rates are depicted. These rates will be discussed more fully below.

Briefly, curve 1702 is associated with a memory cell having a low conduction current, and curve 1704 is associated with a memory cell having a high conduction current. Stated another way, curve 1702 is associated with a memory cell having a Vt above a target Vt. Curve 1704 is associated with a memory cell having a Vt below the target Vt. A demarcation voltage 1706 is shown between these two cases. That is, a final SEN voltage above demarcation voltage 1706 corresponds to a memory cell having a low conduction current, whereas a final SEN voltage below demarcation voltage 1706 corresponds to a memory cell having a high conduction current. The demarcation voltage 1706 thus corresponds to a demarcation current, which defines whether the memory cell's Vt is above/below a target Vt associated with the reference voltage applied to the memory cell.

Next, the voltage on the capacitor 1616 is tested. Referring to FIG. 17, at time t6, the strobe signal STRO goes high. Also note that prior to this at time t5, the reset signal RST went low to reset the latch circuit. Referring to FIG. 16, the sense transistor 1608 will be either on or off in response to the voltage on the sense node SEN. In one embodiment, the demarcation voltage 1706 is equal to the Vt of sense transistor 1608. With the strobe signal STRO high, transistor 1614 is on, which provides a current path between the sense transistor 1608 and the latch circuit 1620. The value of LAT in the data latch 1620 will be set based on whether the sense transistor 1608 conducts. There are two LAT conditions depicted in FIG. 17. LAT (low) corresponds to the low current conduction curve 1702, LAT (high) corresponds to the high current conduction curve 1704.

Note that word line and bit line voltages are not depicted in FIG. 17. In some embodiments, a reference voltage is applied to the selected word line at time t1. The selected word line may be held at the reference voltage at least until sensing the memory cell is complete. Also note that suitable read pass voltages may be applied to unselected word lines. The word line voltages may be provided by, for example, power control 316.

Figure 18:
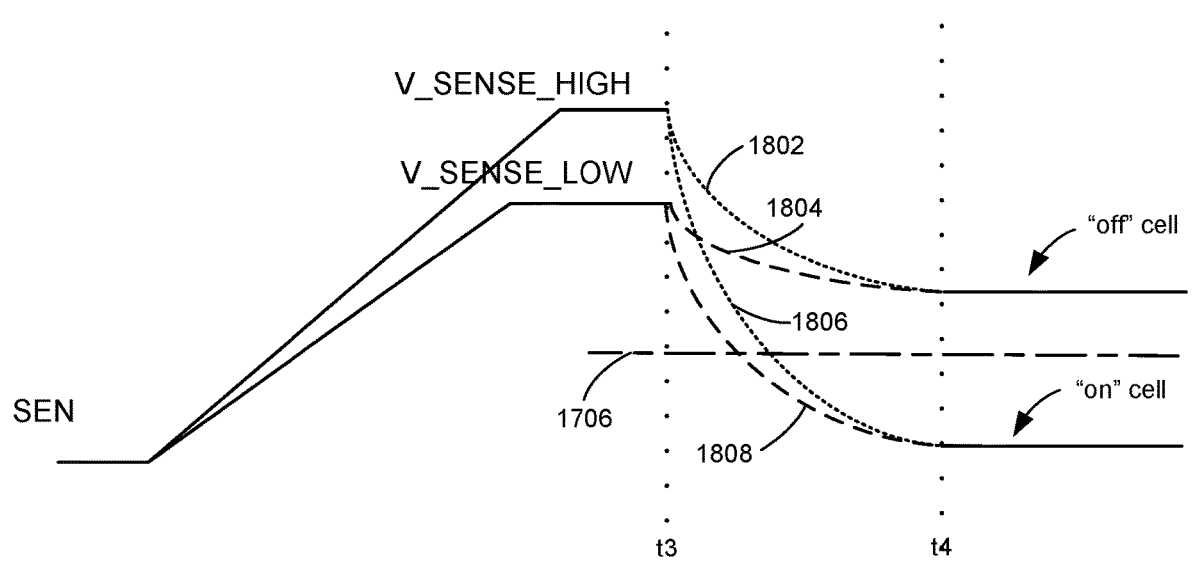
FIG. 18 depicts a timing diagram in which the sense node SEN is charged to different voltages, in accordance with embodiments.

FIG. 18 depicts a timing diagram in which the sense node SEN is charged to different voltages, in accordance with embodiments. The sense node is either charged to V_SENSE_LOW or to V_SENSE_HIGH, in this example. In some embodiments, V_SENSE_LOW is used when it is expected that the memory cell current will be lower than normal due to a factor such as a lower than normal bit line voltage. On the other hand, V_SENSE_HIGH may be used when it is expected that the memory cell current will be normal. Note that a normal current refers to the current that would normally be expected given the reference voltage applied to the selected word line.

Plot 1802 shows the voltage at SEN for an "off" memory cell for the V_SENSE_HIGH case. Plot 1804 shows the voltage at SEN for an "off" memory cell for the V_SENSE_LOW case. Plot 1806 shows the voltage at SEN for an "on" memory cell for the V_SENSE_HIGH case. Plot 1804 shows the voltage at SEN for an "on" memory cell for the V_SENSE_LOW case.

As noted above, in some embodiments, V_SENSE_LOW is used when it is expected that the memory cell current will be lower than normal due to a factor such as a lower than normal bit line voltage. With reference to plot 1808, note that an "on" memory cell will be sensed as being on due to plot 1808 going below demarcation voltage 1706. Stated another way, a memory cell having a Vt below a target Vt (given the reference voltage applied to the selected WL) will be sensed as an "on" cell. If the lower SEN voltage were not used, then SEN might not discharge to a voltage below demarcation voltage 1706 by time t4. Hence, using the lower sense voltage improves sensing accuracy. Moreover, plot 1804 shows that an "off" memory cell is sensed as being off due to plot 1804 staying above demarcation voltage 1706. Stated another way, a memory cell having a Vt above a target Vt (given the reference voltage applied to the selected WL) will be sensed as an "off" cell.

With reference to plot 1806, note that an "on" memory cell will be sensed as being on due to plot 1806 going below demarcation voltage 1706. Stated another way, plot 1806 shows that a memory cell having a Vt below a target Vt (given the reference voltage applied to the selected WL) will be sensed as an "on" cell. Moreover, plot 1802 shows that an "off" memory cell is sensed as being off due to plot 1802 staying above demarcation voltage 1706. Stated another way, plot 1802 shows that a memory cell having a Vt above the target Vt will be sensed as an "off" cell. V_SENSE_HIGH could be used when it is expected that the memory cell current will be normal. However, in some cases, V_SENSE_HIGH could be used when it is expected that the memory cell current will be higher than normal (optionally, V_SENSE_LOW could be used when it is expected that the memory cell current will be normal).

Figure 19:
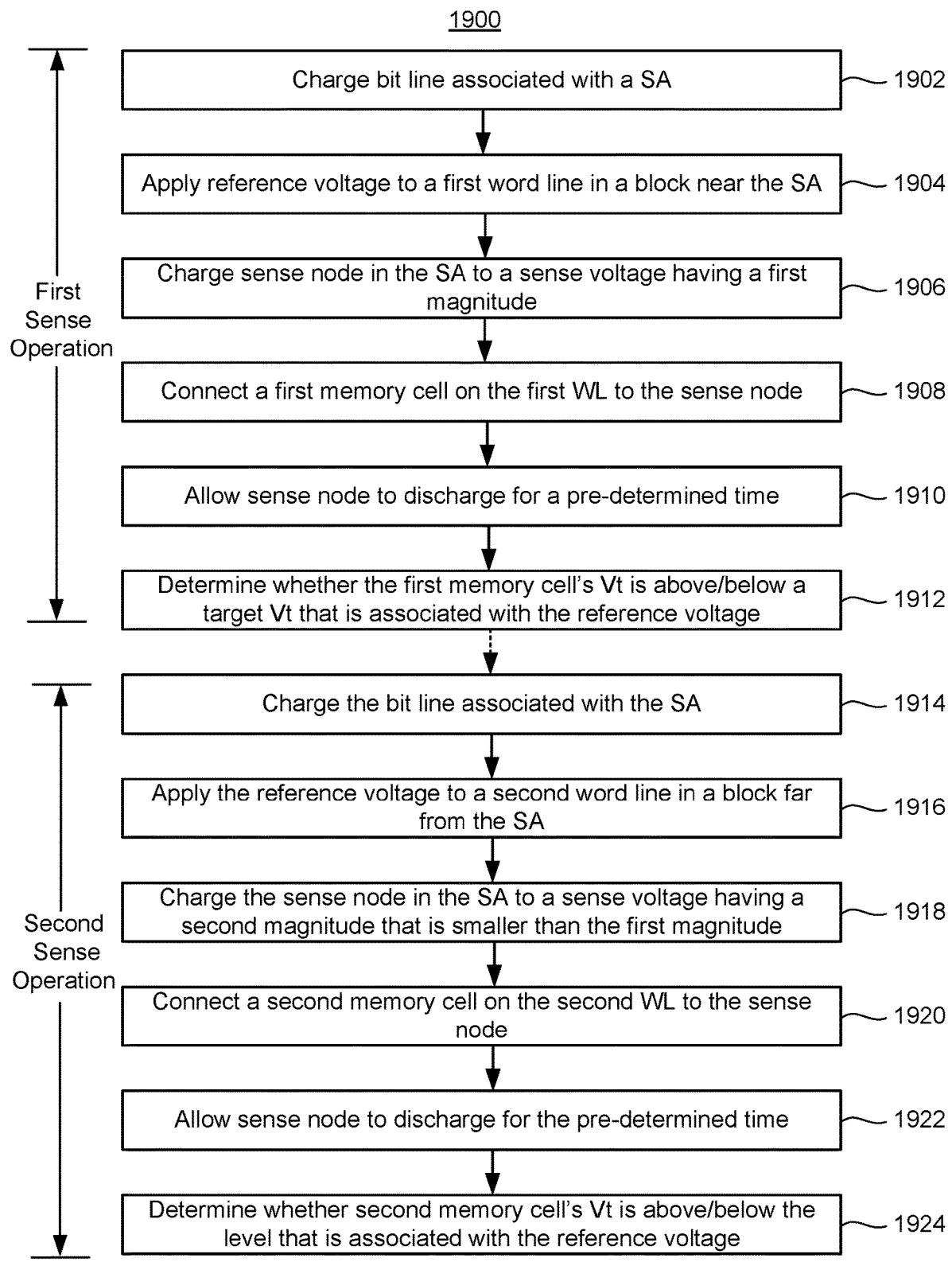
FIG. 19 is a flowchart of one embodiment of a process of sensing memory cells in which a sense node is charged to different sense voltages when sensing different memory cells.

As noted in the discussion of process 1300, in some embodiments, the same sense node is charged to different sense voltages to sense different memory cells at different times. FIG. 19 is a flowchart of one embodiment of a process 1900 of sensing memory cells in which a sense node is charged to different sense voltages when sensing different memory cells. Process 1900 provides further details for one embodiment of process 1300. Process 1900 involves a sense amplifier sensing in two different blocks of memory cells. Process 1900 is divided into two sense operations, with the sense amplifier performing one sense operation in each block. With reference to FIG. 9, the sense amplifier could be any of SA0-SAn. The two blocks could be any two of the blocks. In some cases, the blocks are divided into two or more zones, based on distance from the sense amplifiers. In such embodiments, the two blocks are in different zones. As discussed above, the distance between a block and the sense amplifier may relate to the bit line resistance. As discussed above, the distance between a block and the sense amplifier may relate to the bit line voltage at the block. Reference will be made to FIG. 9 when discussing process 1900; however, process 1900 is not limited to the architecture depicted in FIG. 9.

Step 1902 includes charging a bit line associated with a sense amplifier. For example, SA4 charges BL4 (see FIG. 9). In some embodiments, the bit line voltage is held at this voltage during the sensing operation. As discussed above, charging the bit line, as well as holding the bit line voltage, may include applying suitable voltages to transistors 1602 and 1604 (see FIG. 16).

Step 1904 includes applying a reference voltage to a first word line in a block near the sense amplifier. The reference voltage could be, but is not limited to, a read reference voltage or a verify reference voltage. For the sake of example, the blocks in FIG. 9 may be divided into two sets. The block in one set will be referred to as being near the sense amplifiers, with the blocks in the other set being referred to as being far from the sense amplifiers. Each set contains a contiguous group of blocks. The sets could be of the same size, or different sizes.

Step 1906 includes charging the sense node in the sense amplifier to a sense voltage having a first magnitude. The sense node may be charged as described above with respect to the FIGS. 16 and 17. For the sake of illustration, the sense node may be charged to V_SENSE_HIGH (see FIG. 18).

Step 1908 includes connecting a first memory cell on the first WL to the sense node. In one embodiment, XXL is raised high to turn on transistor 1606 to connect the first memory cell to SEN.

Step 1910 includes allowing the sense node to discharge for a pre-determined time. In one embodiment, XXL remains high between t3 and t4 (see FIGS. 16, 17) to discharge SEN for a pre-determined time.

Step 1912 includes determining whether the first memory cell's Vt is above or below a target Vt that is associated with the reference voltage. In one embodiment, the voltage on SEN is tested to determine whether the voltage is above or below the demarcation voltage 1706. As described above, if the voltage at SEN is below the demarcation voltage 1706, then the memory cell's Vt is below the target Vt. On the other hand, if the voltage at SEN is above the demarcation voltage 1706, then the memory cell's Vt is above the target Vt.

There is a dashed arrow between step 1912 and 1914 to indicate that some time passes between the two sense operations. The sense amplifier could perform many other sense operations between steps 1912 and 1914. Step 1914 includes charging the bit line associated with the sense amplifier. The same sense amplifier may charge the same bit line as in step 1902.

Step 1916 includes applying the reference voltage to a second word line in a block far from the sense amplifier. The reference voltage is the same one that was used in step 1904.

Step 1918 includes charging the sense node in the sense amplifier to a sense voltage having a second magnitude. For the sake of illustration, the sense node may be charged to V_SENSE_LOW (see FIG. 18).

Step 1920 includes connecting a second memory cell on the second WL to the sense node. Step 1922 includes allowing the sense node to discharge for the pre-determined time. Note that this is the same pre-determined time as used in step 1910. In other words, the same integration time is used in steps 1910 and 1922. In one embodiment, XXL remains high between t3 and t4 (see FIGS. 16, 17) to discharge SEN for the pre-determined time.

Step 1924 includes determining whether the second memory cell's Vt is above or below a target Vt that is associated with the reference voltage.

The first sense operation in process 1900 may be used when sensing thousands of memory cells in a first selected block at the same time. The second sense operation in process 1900 may be used when sensing thousands of memory cells in a second selected block at the same time. Process 1900 may be modified to use a third magnitude sense voltage to sense memory cells in a third selected block at the same time. However, note that it is not required that sensing of every memory cell in the same block use the same magnitude sensing voltage. For example, one or more bit lines in a block may have an unusually high resistance, in which case techniques disclosed herein in which the sense voltage depends on BL resistance may be used.

Figure 20:
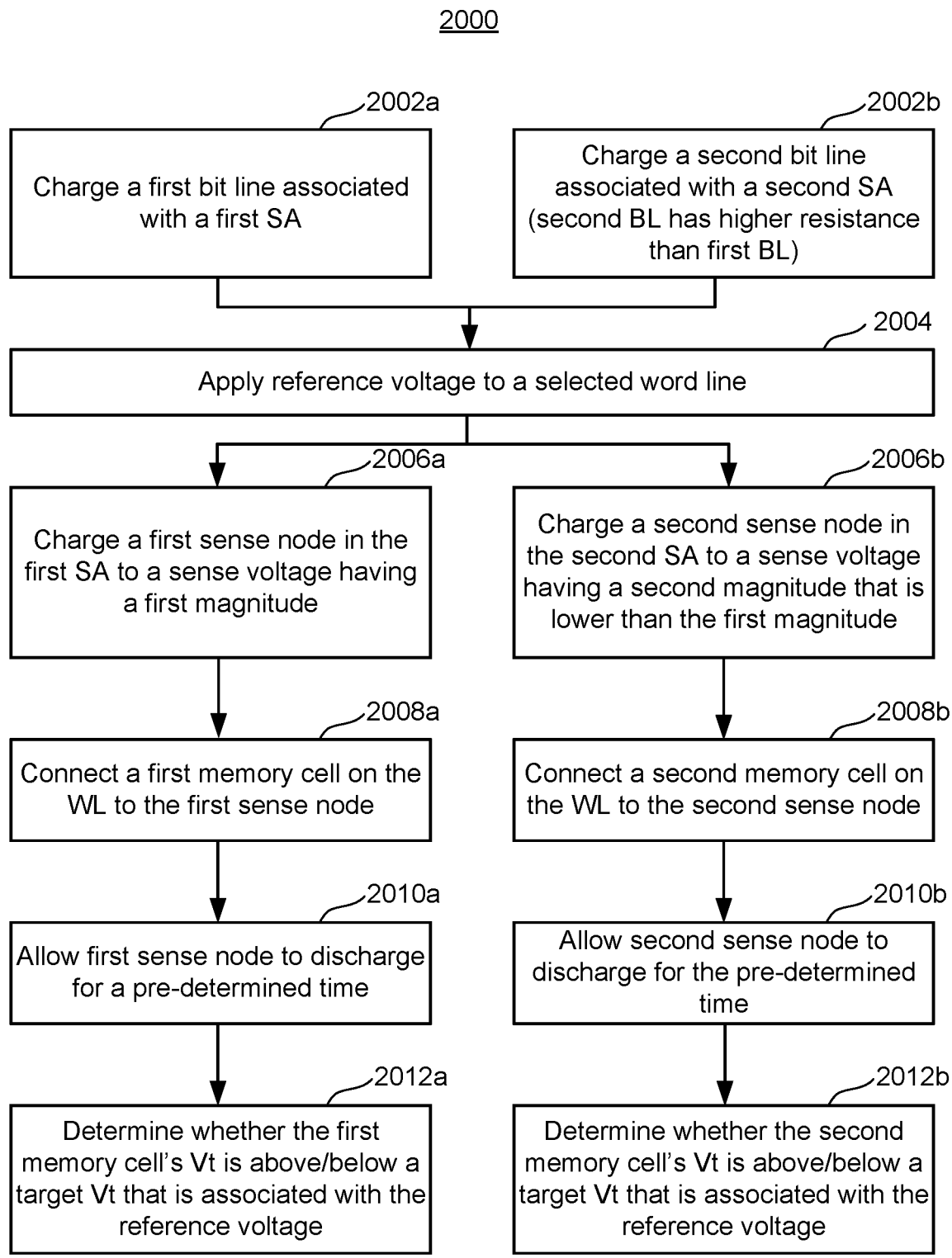
FIG. 20 is a flowchart of one embodiment of a process of sensing memory cells in which two different sense nodes are charged to respective different sense voltages when sensing different memory cells.

As noted in the discussion of process 1300, in some embodiments, different sense nodes are charged to different sense voltages to sense different memory cells at the same time. FIG. 20 is a flowchart of one embodiment of a process 2000 of sensing memory cells in which two different sense nodes are charged to respective different sense voltages when sensing different memory cells. Process 2000 provides further details for one embodiment of process 1300. Process 2000 involves two different sense amplifiers sensing in the same block of memory cells. With reference to FIG. 9, the sense amplifiers could be any two of SA0-SAn. The block could be any of the blocks. Process 1900 is not limited to the architecture depicted in FIG. 9.

Step 2002a includes charging a first bit line associated with a first sense amplifier. For example, SA4 charges BL4. Step 2002b includes charging a second bit line associated with a second sense amplifier. For example, SA2 charges BL2. In some embodiments, the respective bit line voltages are held at their respective voltages during the sensing operation. As discussed above, charging the bit line, as well as holding the bit line voltage, may include applying suitable voltages to transistors 1602 and 1604 (see FIG. 16). In some embodiments, the two sense amplifiers operate in a similar manner such that the BL voltage at the sense amplifiers are essentially the same. However, due to factors such as different BL resistances, the BL voltages at the block may be different from each other. An example will be discussed in which the second BL has a higher resistance than the first BL. This resistance refers to the BL resistance between the selected block and the respective sense amplifiers. More particularly, the resistance for a BL refers to the BL resistance between the sense amplifier and the point at which the BL connects to the NAND string in the selected block.

Step 2004 includes applying a reference voltage to a selected word line in the selected block. The reference voltage could be, but is not limited to, a read reference voltage or a verify reference voltage.

Step 2006a includes charging the first sense node in the first sense amplifier to a sense voltage having a first magnitude. For the sake of illustration, the first sense node may be charged to V_SENSE_HIGH (see FIG. 18). Step 2006b includes charging the second sense node in the second sense amplifier to a sense voltage having a second magnitude. The sense nodes may be charged as described above with respect to the FIGS. 16 and 17. For the sake of illustration, the second sense node may be charged to V_SENSE_LOW (see FIG. 18). In general, the second sense node is charged to a voltage that is less than the voltage to which the first sense node is charged.

Step 2008a includes connecting the first memory cell to the first sense node. Step 2008b includes connecting the first second memory cell to the second sense node. In one embodiment, XXL is raised high to turn on transistor 1606 in the respective sense amplifiers to connect the respective memory cells to SEN in the respective sense amplifiers.

Step 2010a includes allowing the first sense node to discharge for a pre-determined time. Step 2010b includes allowing the second sense node to discharge for the pre-determined time. In one embodiment, XXL remains high between t3 and t4 (see FIGS. 16, 17) to discharge SEN in the respective sense amplifiers for the pre-determined time.

Step 2012a includes determining whether the first memory cell's Vt is above or below a target Vt that is associated with the reference voltage. Step 2012b includes determining whether the second memory cell's Vt is above or below a target Vt that is associated with the reference voltage. In one embodiment, the voltage on SEN in the respective sense amplifiers is tested to determine whether the voltage is above or below the demarcation voltage 1706. As described above, if the voltage at SEN is below the demarcation voltage 1706, then the memory cell's Vt is below the target Vt. On the other hand, if the voltage at SEN is above the demarcation voltage 1706, then the memory cell's Vt is above the target Vt.

Process 2000 may be used when sensing thousands of memory cells in a selected block at the same time. Hence, sensing one set of the memory cells may use the higher magnitude sense voltage, whereas sensing another set of the memory cells may use the lower magnitude sense voltage. Process 2000 may be modified to use a third magnitude sense voltage.

In view of the above, it can be seen that a first embodiment includes an apparatus, comprising a control circuit configured to connect to non-volatile memory cells. The control circuit is further configured to connect to sense nodes associated with the memory cells. The control circuit is configured to charge one or more of the sense nodes to different sense voltages having corresponding different magnitudes. The control circuit is configured to allow the one or more sense nodes to discharge based on respective currents of selected memory cells for a pre-determined time while applying a reference voltage to the selected memory cells. The control circuit is configured to determine whether threshold voltages of the selected memory cells are above or below a target threshold voltage associated with the reference voltage based on respective voltages on the one or more of sense nodes after the pre-determined time.

In a second embodiment, and in furtherance of the first embodiment, the control circuit is configured to charge a first sense node of the one or more sense nodes to a sense voltage having a magnitude that depends on distance between the first sense node and each respective selected memory cell.

In a third embodiment, and in furtherance of the first or second embodiments, the control circuit is configured to vary the magnitude of the sense voltage inversely with distance between the first sense node and each respective selected memory cell.

In a fourth embodiment, and in furtherance of any of the first to third embodiments, the non-volatile memory cells are arranged in blocks. The control circuit is configured to charge a first sense node of the one or more sense nodes to a sense voltage having a magnitude that depends on a location of a block in which a selected memory cell resides.

In a fifth embodiment, and in furtherance of the first embodiment, the control circuit is configured to charge two or more of the sense nodes to a sense voltage having a magnitude that depends on resistances of respective bit lines associated with the selected memory cells.

In a sixth embodiment, and in furtherance of the fifth embodiment, the control circuit is configured to vary the magnitude of the sense voltages on the two or more sense nodes inversely with the resistances of the respective bit lines.

In a seventh embodiment, and in furtherance of the any of the first to sixth embodiments, the apparatus further comprises a memory structure die comprising the non-volatile memory cells and a control die comprising the control circuit and sense amplifiers. The non-volatile memory cells are arranged in blocks. Each sense amplifier comprises a sense node. The control circuit is configured to charge a first sense node in a first sense amplifier of the sense amplifiers to a first sense voltage having a first magnitude. The control circuit is configured to connect a first selected memory cell in a first block to the first sense node while applying the reference voltage to the first selected memory cell to allow a current of the first selected memory cell to discharge the first sense node for the pre-determined time. The first block has a first distance to the first sense amplifier. The control circuit is configured to determine whether a threshold voltage of the first selected memory cell is greater than the target threshold voltage based on a voltage on the first sense node after the sense node has discharged for the pre-determined time. The control circuit is configured to charge the first sense node in the first sense amplifier to a second sense voltage having a second magnitude that is less than the first magnitude. The control circuit is configured to connect a second selected memory cell in a second block to the first sense node while applying the reference voltage to the second memory cell to allow a current of the second selected memory cell to discharge the first sense node for the pre-determined time, wherein the second block has a second distance to the first sense amplifier that is greater than the first distance. The control circuit is configured to determine whether a threshold voltage of the second selected memory cell is greater than the target threshold voltage based on a voltage on the first sense node after the sense node has discharged for the pre-determined time.

In an eighth embodiment, and in furtherance of the any of the first to sixth embodiments, the apparatus further comprises a memory structure die comprising the non-volatile memory cells. The memory structure die further comprises bit lines associated with the non-volatile memory cells. The apparatus further comprises a control die comprising the control circuit and sense amplifiers, wherein each the sense amplifier comprises a sense node and is associated with one of the bit lines. The control circuit is further configured to charge a first sense node in a first sense amplifier of the sense amplifiers to a first sense voltage having a first magnitude. The control circuit is further configured to connect a first selected memory cell associated with a first bit line to the first sense node while applying the reference voltage to the first memory cell to allow a current of the first selected memory cell to discharge the first sense node for the pre-determined time. The control circuit is further configured to determine whether a threshold voltage of the first selected memory cell is greater than the target threshold voltage based on a voltage on the first sense node after the first sense node has discharged for the pre-determined time. The control circuit is further configured to charge a second sense node in a second sense amplifier of the sense amplifiers to a second sense voltage having a second magnitude that is lower than the first magnitude. The control circuit is further configured to connect a second selected memory cell associated with a second bit line to the second sense node while applying the reference voltage to the second selected memory cell to allow a current of the second selected memory cell to discharge the second sense node for the pre-determined time, wherein the second bit line has a greater resistance than the first bit line. The control circuit is further configured to determine whether a threshold voltage of the second selected memory cell is greater than the target threshold voltage based on a voltage on the second sense node after the second sense node has discharged for the pre-determined time.

In a ninth embodiment, and in furtherance of the any of the first to eighth embodiments, the non-volatile memory cells are arranged as NAND strings, the NAND strings are connected to bit lines. The control circuit is further configured to charge bit lines associated with the selected memory cells to bit line voltages. The control circuit is further configured charge the one or more sense nodes to sense voltages that compensate for differences in the bit line voltages at the NAND strings when the selected memory cells are being sensed.

One embodiment includes a method of operating non-volatile storage. The method comprises charging a sense node in a sense amplifier to a first voltage. The method comprises connecting a first selected memory cell in a first block to the sense node while applying a voltage having a reference magnitude to the first selected memory cell to allow a current of the first selected memory cell to discharge the sense node for a pre-determined time. The method comprises determining whether the first selected memory cell has a threshold voltage greater than a target threshold voltage associated with the reference magnitude based on a voltage on the sense node after the sense node has discharged for the pre-determined time. The method comprises charging the sense node to a second voltage having a different magnitude from the first voltage. The method comprises connecting a second selected memory cell in a second block to the sense node while applying a voltage having the reference magnitude to the second selected memory cell to allow a current of the second selected memory cell to discharge the sense node for the pre-determined time. The method comprises determining whether the second selected memory cell has a threshold voltage greater than the target threshold voltage based on a voltage on the sense node after the sense node has discharged for the pre-determined time.

One embodiment includes a non-volatile storage system, comprising a plurality of word lines, a plurality of bit lines, NAND strings comprising non-volatile memory cells, a plurality of sense amplifiers, and a control circuit. The non-volatile memory cells are associated with the plurality of word lines. Each NAND string is associated with a bit line of the plurality of bit lines. Each sense amplifier has a sense node and is associated with a bit line of the plurality of bit lines. The control circuit charges selected bit lines associated with selected memory cells to bit line voltages. The control circuit charges one or more sense nodes to respective sense voltages that compensate for variations in the bit line voltages at the NAND strings when the selected memory cells are connected to the one or more sense nodes. The control circuit connects the selected memory cells to the one or more sense nodes while applying a reference voltage to the selected memory cells to allow a current of the selected memory cells to discharge the one or more sense nodes for a pre-determined time. The control circuit determines whether respective threshold voltages of the selected memory cells are greater than a target threshold voltage associated with the reference voltage based on a voltage on the one or more sense nodes after the one or more sense nodes has discharged for the pre-determined time.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:
1. An apparatus comprising:
 a control circuit configured to connect to non-volatile memory cells, the control circuit further configured to connect to sense nodes associated with the memory cells, wherein the control circuit is configured to:
  charge one or more of the sense nodes to different sense voltages having corresponding different magnitudes, including charging a first sense node of the one or more sense nodes to a sense voltage having a mag- nitude that depends inversely on distance between the first sense node and each respective selected memory cell;

allow the one or more sense nodes to discharge based on respective currents of selected memory cells for a pre-determined time while applying a reference voltage to the selected memory cells; and determine whether threshold voltages of the selected memory cells are above or below a target threshold voltage associated with the reference voltage based on respective voltages on the one or more of sense nodes after the pre-determined time.

2. The apparatus of claim 1, wherein:
the non-volatile memory cells are arranged in blocks; and
the control circuit is configured to charge the first sense node to a sense voltage having a magnitude that depends on a location of a block in which a selected memory cell resides.

3. The apparatus of claim 1, wherein the control circuit is further configured to charge two or more of the sense nodes to a sense voltage having a magnitude that depends on resistances of respective bit lines associated with the selected memory cells.

4. The apparatus of claim 3, wherein the control circuit is configured to vary the magnitude of the sense voltages on the two or more sense nodes inversely with the resistances of the respective bit lines.

5. The apparatus of claim 1, wherein the apparatus further comprises:
a memory structure die comprising the non-volatile memory cells, wherein the non-volatile memory cells are arranged in blocks; and
a control die comprising the control circuit and sense amplifiers, wherein each sense amplifier comprises a sense node, wherein the control circuit is configured to:
charge the first sense node in a first sense amplifier of the sense amplifiers to a first sense voltage having a first magnitude;
connect a first selected memory cell in a first block to the first sense node while applying the reference voltage to the first selected memory cell to allow a current of the first selected memory cell to discharge the first sense node for the pre-determined time, wherein the first block has a first distance to the first sense amplifier;
determine whether a threshold voltage of the first selected memory cell is greater than the target threshold voltage based on a voltage on the first sense node after the sense node has discharged for the pre-determined time;
charge the first sense node in the first sense amplifier to a second sense voltage having a second magnitude that is less than the first magnitude;
connect a second selected memory cell in a second block to the first sense node while applying the reference voltage to the second selected memory cell to allow a current of the second selected memory cell to discharge the first sense node for the pre-determined time, wherein the second block has a second distance to the first sense amplifier that is greater than the first distance; and
determine whether a threshold voltage of the second selected memory cell is greater than the target threshold voltage based on a voltage on the first sense node after the sense node has discharged for the pre-determined time.

6. The apparatus of claim 1, wherein the apparatus further comprises:
a memory structure die comprising the non-volatile memory cells, wherein the memory structure die further comprises bit lines associated with the non-volatile memory cells; and
a control die comprising the control circuit and sense amplifiers, wherein each the sense amplifier comprises a sense node and is associated with one of the bit lines, wherein the control circuit is further configured to:
charge a second sense node in a first sense amplifier of the sense amplifiers to a second sense voltage having a first magnitude;
connect a first selected memory cell associated with a first bit line to the second sense node while applying the reference voltage to the first selected memory cell to allow a current of the first selected memory cell to discharge the second sense node for the pre-determined time;
determine whether a threshold voltage of the first selected memory cell is greater than the target threshold voltage based on a voltage on the second first sense node after the second sense node has discharged for the pre-determined time;
charge a third sense node in a second sense amplifier of the sense amplifiers to a second sense voltage having a second magnitude that is lower than the first magnitude;
connect a second selected memory cell associated with a second bit line to the third sense node while applying the reference voltage to the second selected memory cell to allow a current of the second selected memory cell to discharge the third sense node for the pre-determined time, wherein the second bit line has a greater resistance than the first bit line; and
determine whether a threshold voltage of the second selected memory cell is greater than the target threshold voltage based on a voltage on the second sense node after the second sense node has discharged for the pre-determined time.

7. The apparatus of claim 1, wherein:
the non-volatile memory cells are arranged as NAND strings;
the NAND strings are connected to bit lines; and
the control circuit is further configured to:
charge bit lines associated with the selected memory cells to bit line voltages; and
charge the one or more sense nodes to sense voltages that compensate for differences in the bit line voltages at the NAND strings when the selected memory cells are being sensed.

8. A method of operating non-volatile storage, the method comprising:
charging a sense node in a sense amplifier to a first voltage;
connecting a first selected memory cell in a first block to the sense node while applying a voltage having a reference magnitude to the first selected memory cell to allow a current of the first selected memory cell to discharge the sense node for a pre-determined time;
determining whether the first selected memory cell has a threshold voltage greater than a target threshold voltage associated with the reference magnitude based on a voltage on the sense node after the sense node has discharged for the pre-determined time;
charging the sense node to a second voltage having a different magnitude from the first voltage;

connecting a second selected memory cell in a second block to the sense node while applying a voltage having the reference magnitude to the second selected memory cell to allow a current of the second selected memory cell to discharge the sense node for the pre-determined time; and determining whether the second selected memory cell has a threshold voltage greater than the target threshold voltage based on a voltage on the sense node after the sense node has discharged for the pre-determined time.

9. The method of claim 8, further comprising:
determining a magnitude for the first voltage based on a first distance between the sense node and the first block; and
determining a magnitude for the second voltage based on a second distance between the sense node and the second block.

10. The method of claim 9, further comprising:
determining that the first voltage is smaller than the second voltage in response to the second distance being longer than the first distance.

11. The method of claim 9, further comprising:
determining that the first voltage is smaller than the second voltage in response to a first distance along a bit line between the first block and the sense node being greater than a second distance along the bit line between the second block and the sense node.

12. A non-volatile storage system, comprising:
a plurality of word lines;
a plurality of bit lines;
NAND strings comprising non-volatile memory cells, the non-volatile memory cells associated with the plurality of word lines, each NAND string associated with a bit line of the plurality of bit lines;
a plurality of sense amplifiers, each sense amplifier having a sense node, each sense amplifier associated with a bit line of the plurality of bit lines; and
a control circuit that:
charges selected bit lines associated with selected memory cells to bit line voltages;
charges two or more sense nodes to respective sense voltages that compensate for differences in the bit line voltages at respective NAND strings when selected memory cells of the respective NAND strings are connected to the two or more sense nodes, wherein the control circuit is configured to charge the two or more sense nodes to a sense voltage having a magnitude that depends on resistances of respective bit lines associated with the selected memory cells, wherein the control circuit is configured to vary the magnitude of the sense voltages on the two or more sense nodes inversely with the resistances of the respective bit lines;
connects the selected memory cells to the two or more sense nodes while applying a reference voltage to the selected memory cells to allow a current of the selected memory cells to discharge the two or more sense nodes for a pre-determined time; and
determines whether respective threshold voltages of the selected memory cells are greater than a target threshold voltage associated with the reference voltage based on a voltage on the two or more sense nodes after the two or more sense nodes has discharged for the pre-determined time.

13. The non-volatile storage system of claim 12, wherein the control circuit further charges a first sense node to respective sense voltages that compensate for differences in the bit line voltages at the NAND strings due to different distances between the first sense node and the respective NAND strings.

14. The non-volatile storage system of claim 13, wherein the control circuit further varies a magnitude of the sense voltage on the first sense node inversely with distance between the first sense node and the respective NAND strings.

15. The non-volatile storage system of claim 12, wherein:
a first bit line of the respective bit lines has a first resistance between a first sense node of the two or more sense nodes and a first NAND string of the respective NAND strings;
a second bit line of the respective bit lines has a second resistance between a second sense node of the two or more sense nodes and a second NAND string of the respective NAND strings; and
the control circuit charges the first sense node and the second sense node to different sense voltages to compensate for the first resistance being different than the second resistance.

16. The non-volatile storage system of claim 15, wherein the control circuit charges the first sense node to a greater sense voltage than the second sense node due to the second resistance being greater than the first resistance.

17. The non-volatile storage system of claim 15, wherein the first NAND string and the second NAND string are in the same block of non-volatile memory cells.

18. The non-volatile storage system of claim 15, wherein the first NAND string and the second NAND string are in different blocks of non-volatile memory cells.

* * * * *